US012616044B2

(12) United States Patent (10) Patent No.: US 12,616,044 B2
Jeong (45) Date of Patent: Apr. 28, 2026

(54) SEMICONDUCTOR PACKAGES AND METHODS OF MANUFACTURING THE SAME

(71) Applicant: Samsung Electronics Co., Ltd., Suwon-si (KR)

(72) Inventor: Kwangok Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 419 days.

(21) Appl. No.: 18/316,482

(22) Filed: May 12, 2023

(65) Prior Publication Data

US 2024/0055342 A1     Feb. 15, 2024

(30) Foreign Application Priority Data

Aug. 9, 2022     (KR) ......................... 10-2022-0099352

(51) Int. Cl.
  *H01L 23/498*          (2006.01)
  *H01L 23/00*           (2006.01)
        (Continued)
(52) U.S. Cl.
  CPC .... *H01L 23/49838* (2013.01); *H01L 23/3121* (2013.01); *H01L 23/49822* (2013.01);
        (Continued)
(58) Field of Classification Search
  CPC . H01L 23/3185; H01L 23/3157; H01L 21/56; H01L 21/563; H01L 21/568;
        (Continued)

(56) References Cited

U.S. PATENT DOCUMENTS 8,269,345 B2 *   9/2012   Patel ...................... H01L 24/16
                                                   257/737
8,357,860 B2     1/2013   Kaneko
                    (Continued)

*Primary Examiner* — Wael M Fahmy
*Assistant Examiner* — Quinton A Brasfield
(74) *Attorney, Agent, or Firm* — Wolf, Greenfield & Sacks, P.C.

(57)          ABSTRACT

An electronic package includes a redistribution wiring layer having redistribution wiring with a redistribution pad, and a bonding pad on the redistribution pad of the redistribution wiring. The bonding pad includes first, second, and third plating patterns. The first plating pattern is on the redistribution pad, and the first plating pattern includes a first material. Moreover, the first plating pattern has an inclined sidewall so that a diameter of the first plating patter decreases with increasing distance from the redistribution pad so that a first diameter of the first plating pattern adjacent the redistribution pad is greater than a second diameter of the first plating pattern spaced apart from the redistribution pad. The second plating pattern is on the first plating pattern, and the second plating pattern includes a second material different than the first material. The third plating pattern is on the second plating pattern, and the third plating pattern includes a third material different than the second material. Moreover, the second and third plating patterns have a same diameter that is no greater than the second diameter of the first plating pattern.

19 Claims, 25 Drawing Sheets

10

(51) Int. Cl.

| | |
|---|---|
| *H01L 23/31* | (2006.01) |
| *H01L 25/065* | (2023.01) |
| *H01L 25/10* | (2006.01) |

(52) U.S. Cl.
CPC ........ *H01L 23/49866* (2013.01); *H01L 24/16* (2013.01); *H01L 25/0657* (2013.01); *H01L 25/105* (2013.01); *H01L 2224/16227* (2013.01); *H01L 2225/0651* (2013.01); *H01L 2225/06568* (2013.01); *H01L 2225/1058* (2013.01)

(58) Field of Classification Search
CPC ........... H01L 23/5389; H01L 23/49827; H01L 23/5384; H01L 23/481; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2225/06541–06544; H01L 2225/06548; H01L 21/76898; H01L 21/486; H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/315; H01L 23/3135; H05K 1/185
See application file for complete search history.

(56) References Cited

U.S. PATENT DOCUMENTS

| | | | | |
|---|---|---|---|---|
| 8,598,030 B2 * | 12/2013 | Kuo | ......................... | H01L 24/11 |
| | | | | 257/E21.585 |
| 8,823,166 B2 * | 9/2014 | Lin | ......................... | H01L 24/11 |
| | | | | 257/737 |
| 9,136,211 B2 | 9/2015 | Wang et al. | | |
| 9,922,928 B2 | 3/2018 | Tonegawa | | |
| 9,929,100 B2 | 3/2018 | Lee et al. | | |
| 2022/0013409 A1 | 1/2022 | Ohno et al. | | |
| 2022/0015234 A1 | 1/2022 | Ohno et al. | | |
| 2022/0130786 A1 * | 4/2022 | Jung | ...................... | H01L 24/24 |

* cited by examiner

FIG. 4

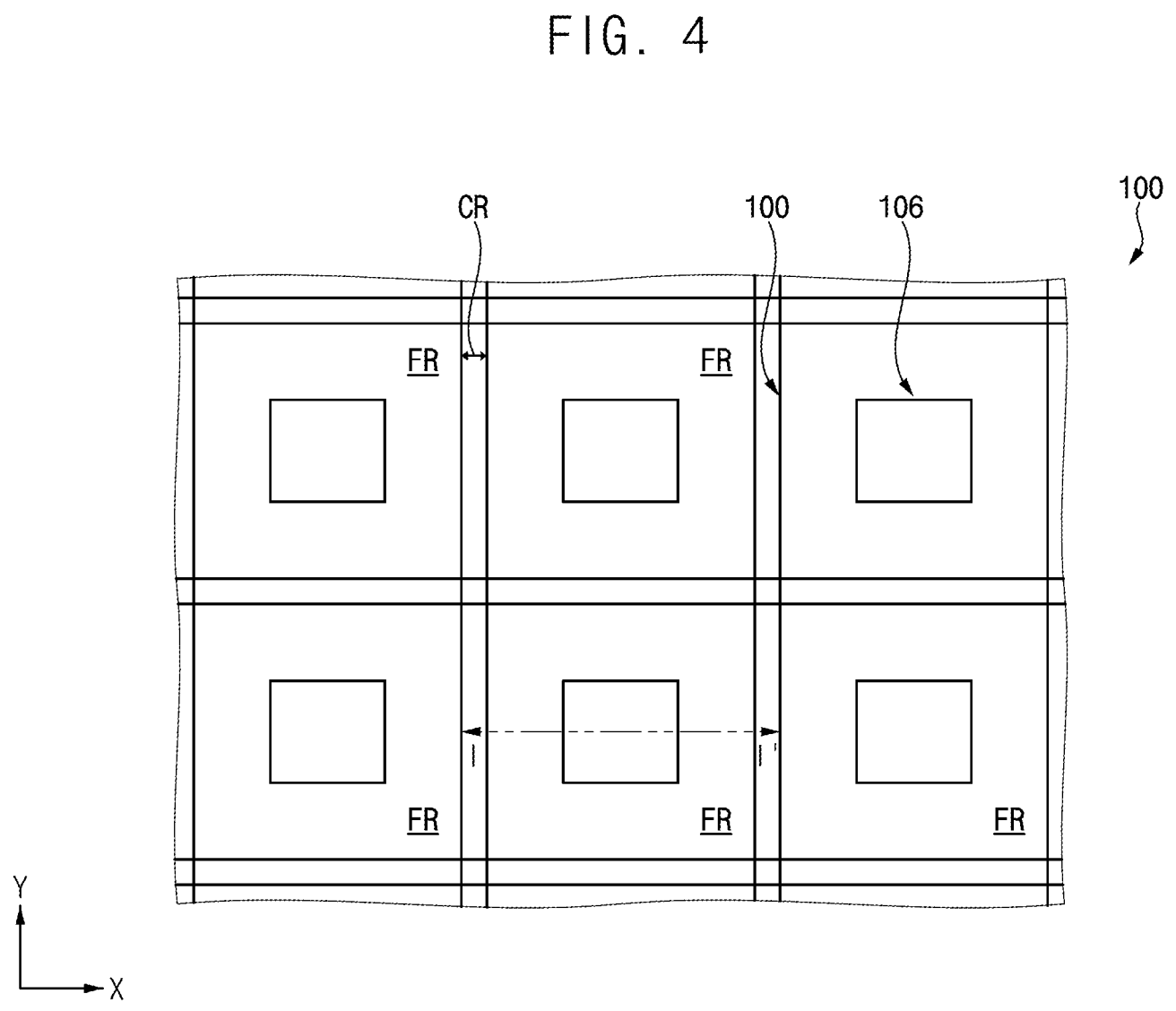

SEMICONDUCTOR PACKAGES AND METHODS OF MANUFACTURING THE SAME

PRIORITY STATEMENT

This application claims priority under 35 U.S.C. § 119 to Korean Patent Application No. 10-2022-0099352, filed on Aug. 9, 2022, in the Korean Intellectual Property Office (KIPO), the contents of which are hereby incorporated herein by reference in their entirety.

BACKGROUND

The present disclosure relates to semiconductor packages and related methods of manufacturing and more particularly to fan-out semiconductor packages and related methods of manufacturing.

In manufacturing a fan-out package, bonding pads for bonding with solder bumps may be formed using a plating process after forming a redistribution wiring layer. A dry resist film used in the plating process may have poor adhesion to an underlying redistribution pad, so that portions of the dry film resist film on a peripheral region of the redistribution pad may be lifted to form a space resembling bird's beak. Because a plating pattern is formed to fill the space in the plating process, an undercut may be formed in the redistribution pad due to galvanic corrosion in a subsequent etching process, and voids may be generated when a passivation layer is formed to expose the plating pattern. As a result, defects may occur later due to cracks.

SUMMARY

Some example embodiments may provide semiconductor packages having improved reliability.

Some example embodiments may provide methods of manufacturing semiconductor packages.

According to some example embodiments, a semiconductor package includes a core substrate having a cavity, a semiconductor chip, a lower redistribution wiring layer, a sealing layer, second redistribution wirings, and a bonding pad. The semiconductor chip is in the cavity of the core substrate, and the semiconductor chip has chip pads. The lower redistribution wiring layer is on a first surface of the core substrate, and the lower redistribution wiring layer includes first redistribution wirings electrically connected to the chip pads of the semiconductor chip. The sealing layer is on a second surface of the core substrate opposite to the first surface of the core substrate, and the sealing layer fills portions of the cavity adjacent the semiconductor chip. The second redistribution wirings are on the sealing layer, the second redistribution wirings are electrically connected to conductive structures that extend through the core substrate, and the second redistribution wiring includes a redistribution pad. A bonding pad is on the redistribution pad of the second redistribution wiring, and the bonding pad includes first, second, and third plating patterns. The first plating pattern is on the redistribution pad, and the first plating pattern has an inclined sidewall with a diameter that gradually decreases with increasing distance from the core substrate. The second plating pattern is on the fpirst plating pattern. The third plating pattern is on the second plating pattern, and the third plating pattern has a diameter that is the same as a diameter of the second plating pattern.

According to some example embodiments, a semiconductor package includes a first redistribution wiring layer having first redistribution wirings, a semiconductor chip, a base substrate, and a second redistribution wiring layer having second redistribution wirings. The semiconductor chip is on the first redistribution wiring layer and electrically connected to the first redistribution wirings. The base substrate is on the first redistribution wiring layer, and the base substrate at least partially surrounds the semiconductor chip. The second redistribution wiring layer is on the base substrate so that the base substrate and the semiconductor chip are between the first and second redistribution wiring layers, and the second redistribution wiring layer includes a sealing layer on the semiconductor chip. The second redistribution wirings are electrically connected to a conductive structure of the base substrate, and a bonding pad is on a redistribution pad of the second redistribution wiring. Moreover, the bonding pad includes first, second, and third plating patterns. The first plating pattern is on the redistribution pad, and the first plating pattern includes a base portion having a diameter that is less than a diameter of the redistribution pad and an edge portion protruding from the base portion to at least partially surround an outer surface of the base portion. Moreover, the edge portion has an inclined sidewall such that a diameter of the edge portion decreases with increasing distance from the base substrate. The second plating pattern is on the first plating pattern, and the third plating pattern is on the second plating pattern.

According to some example embodiments, a semiconductor package includes a semiconductor chip having chip pads, a core substrate at least partially surrounding the semiconductor chip, a first redistribution wiring layer, and a second redistribution wiring layer. The first redistribution wiring layer is on a first surface of the core substrate, and the first redistribution wiring layer includes first redistribution wirings electrically connected to the chip pads. The second redistribution wiring layer is on the core substrate so that the core substrate and the semiconductor chip are between the first and second redistribution wiring layers. The second redistribution wiring layer includes a sealing layer on the semiconductor chip, second redistribution wirings electrically connected to a conductive structure of the core substrate, and a bonding pad on a redistribution pad of the second redistribution wiring. The bonding pad includes first, second, and third plating patterns. The first plating pattern is on the redistribution pad, and the first plating pattern includes a base portion having a diameter smaller than a diameter of the redistribution pad and an edge portion protruding from the base portion to at least partially surround an outer surface of the base portion. The second plating pattern is on the second plating pattern, and the third plating pattern on the second plating pattern.

According to some example embodiments, an electronic package includes a redistribution wiring layer having redistribution wiring with a redistribution pad, and a bonding pad on the redistribution pad of the redistribution wiring. The bonding pad includes first, second, and third plating patterns. The first plating pattern is on the redistribution pad, and the first plating pattern includes a first material. Moreover, the first plating pattern has an inclined sidewall so that a diameter of the first plating pattern decreases with increasing distance from the redistribution pad so that a first diameter of the first plating pattern adjacent the redistribution pad is greater than a second diameter of the first plating pattern spaced apart from the redistribution pad. The second plating pattern is on the first plating pattern, and the second plating pattern includes a second material different than the first material. The third plating pattern is on the second plating pattern, and the third plating pattern includes a third material different than the second material. Moreover, the second and third plating patterns have a same diameter that is no greater than the second diameter of the first plating pattern.

According to some example embodiments, an upper redistribution wiring layer of a semiconductor package may include bonding pads on redistribution pads of a redistribution wiring. The bonding pad may include first, second and third plating patterns sequentially stacked on the redistribution pad. A diameter of the first plating pattern may gradually decrease toward the top. A diameter of a lower portion of the first plating pattern may be greater than a diameter of an upper portion of the first plating pattern. The diameter of the lower portion of the first plating pattern may be equal to or smaller than a diameter of the redistribution pad. The lower portion of the first plating pattern may be formed on the redistribution pad, for example, to cover an entire upper surface of the redistribution pad.

According to some example embodiments, the third plating pattern may include gold (Au), and an upper surface of the redistribution pad under the third plating pattern including gold (Au) may be covered by the first plating pattern. Accordingly, undercutting of the redistribution pad due to galvanic corrosion during an etching operation performed after forming the bonding pad may be reduced and/or prevented.

BRIEF DESCRIPTION OF THE DRAWINGS

Example embodiments will be more clearly understood from the following detailed description taken in conjunction with the accompanying drawings. FIGS. 1 to 29 represent non-limiting, example embodiments as described herein.

FIG. 1 is a cross-sectional view illustrating a semiconductor package in accordance with some example embodiments of inventive concepts.

FIG. 2 is an enlarged cross-sectional view illustrating portion 'A' in FIG. 1 according to a first comparative example.

FIG. 3 is an enlarged cross-sectional view illustrating portion 'A' in FIG. 1 according to a second comparative example.

FIGS. 4 to 17 are views illustrating operations of a method of manufacturing a semiconductor package in accordance with some example embodiments of inventive concepts.

FIG. 18 is a cross-sectional view illustrating a bonding pad in accordance with some example embodiments of inventive concepts.

FIG. 19 is a cross-sectional view illustrating a bonding pad in accordance with some example embodiments of inventive concepts.

FIG. 20 is a cross-sectional view illustrating a semiconductor package in accordance with some example embodiments of inventive concepts.

FIG. 21 is an enlarged cross-sectional view illustrating portion 'C' in FIG. 20.

FIG. 22 is a cross-sectional view illustrating a semiconductor package in accordance with some example embodiments of inventive concepts.

FIG. 23 is an enlarged cross-sectional view illustrating portion 'D' in FIG. 22.

FIGS. 24 to 29 are cross-sectional views illustrating operations of a method of manufacturing a semiconductor package in accordance with some example embodiments of inventive concepts.

DETAILED DESCRIPTION OF EXAMPLE EMBODIMENTS

Figure 1:
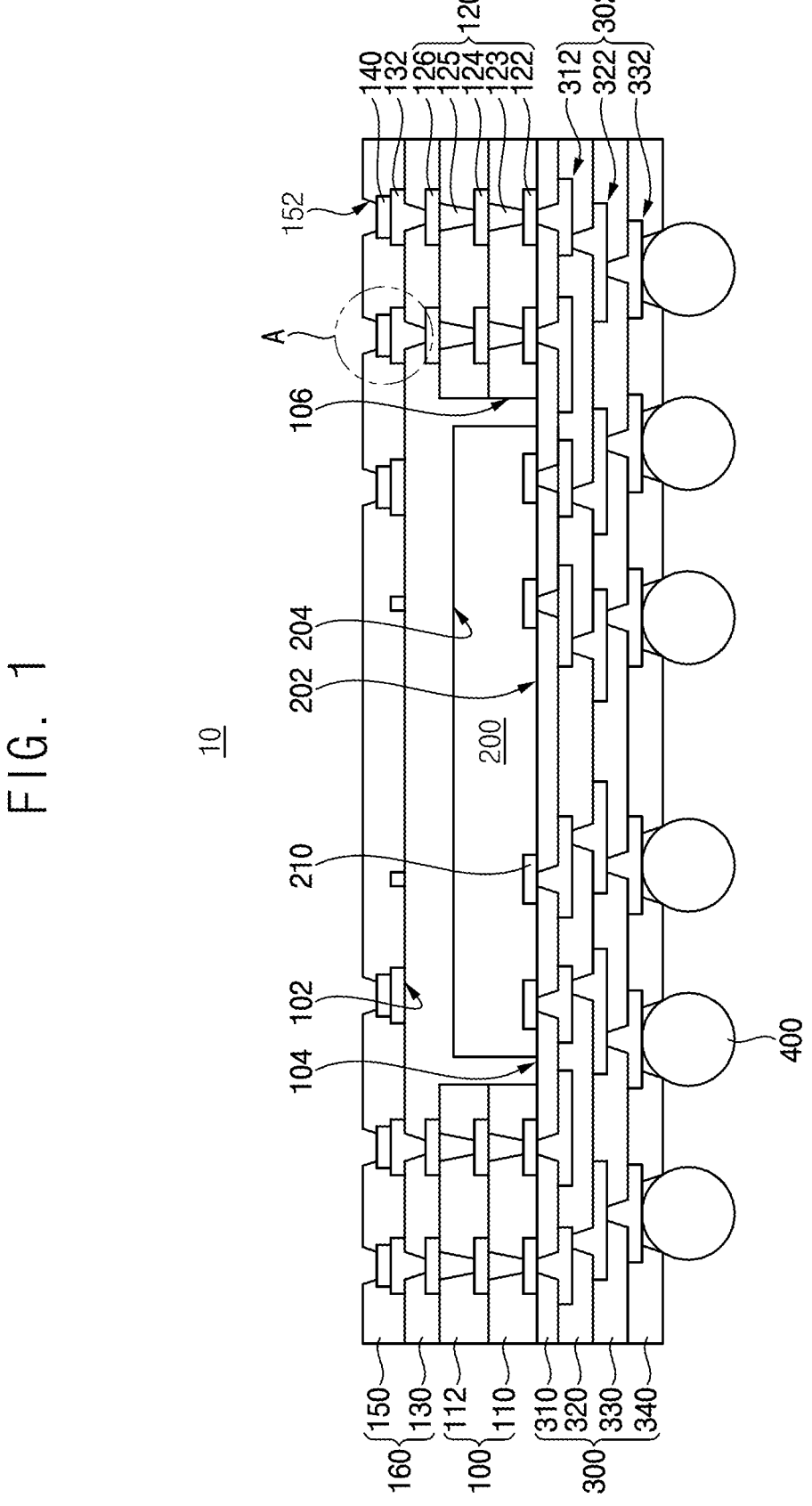

Reference will now be made in detail to embodiments, examples of which are illustrated in the accompanying drawings, wherein like reference numerals refer to like elements throughout and the sizes of each of the elements may be exaggerated for clarity and conveniences of explanation.

Spatially relative terms, such as "beneath," "below," "lower," "above," "upper," "vertical," "front", "back" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected to" or "in contact with" another element, it can be directly on or directly connected to or directly in contact with the other element, or intervening elements may be present. In contrast, when an element is referred to as being "directly on" or "directly connected to" or "directly in contact with" another element, there are no intervening elements present.

Hereinafter, some example embodiments of inventive concepts will be explained in detail with reference to the accompanying drawings.

Figure 2:
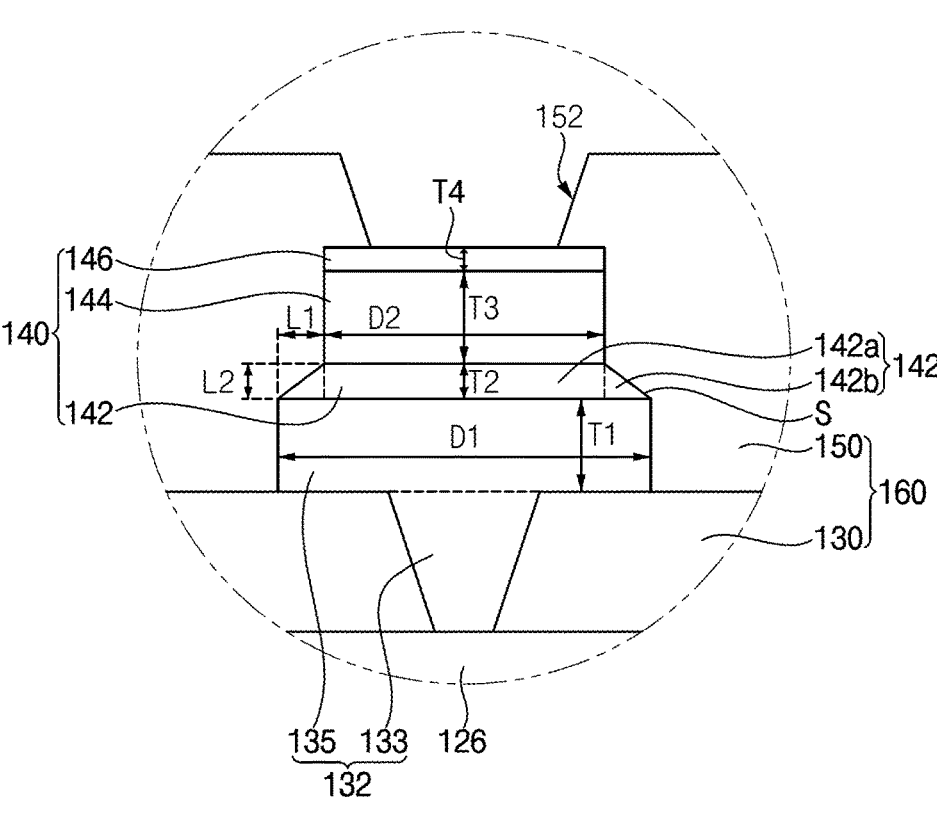

FIG. 1 is a cross-sectional view illustrating a semiconductor package in accordance with some example embodiments of inventive concepts. FIG. 2 is an enlarged cross-sectional view illustrating portion 'A' in FIG. 1.

Referring to FIGS. 1 and 2, a semiconductor package 10 may include a core substrate 100, at least one semiconductor chip 200 provided in the core substrate 100, a lower redistribution wiring layer 300 provided on a lower surface 104 of the core substrate 100, and an upper redistribution wiring layer 160 provided on an upper surface 102 of the core substrate 100. Additionally, the semiconductor package 10 may further include outer connection members 400 provided on an outer surface of the lower redistribution wiring layer 300.

In some example embodiments of inventive concepts, the semiconductor package 10 may include the core substrate 100 provided as a base member which at least partially surrounds the semiconductor chip 200. The core substrate 100 may serve as a frame at least partially surrounding the semiconductor chip 200. The core substrate 100 may include core connection wirings 120 which are provided in a fan out region outside an area where the semiconductor chip 200 is arranged to function as an electrical connection path with the semiconductor chip 200. Accordingly, the semiconductor package 10 may be provided as a fan-out package. Additionally, the semiconductor package 10 may be provided as a unit package on which a second package is stacked.

Further, the semiconductor package 10 may be provided as a System In Package (SIP). For example, one or more semiconductor chip(s) may be arranged in the core substrate 100. The semiconductor chip(s) may include a logic chip including logic circuits and/or a memory chip. The logic chip may be a controller to control the memory chip. The memory chip may include various memory circuits such as dynamic random access memory (DRAM) circuits, static random access memory (SRAM) circuits, flash memory circuits, phase-change random access memory (PRAM) circuits, resistive random access memory (ReRAM) circuits, ferroelectric random access memory (FeRAM) circuits, magnetic random access memory (MRAM) circuits, or the like.

In some example embodiments of inventive concepts, the core substrate 100 may have a first surface (upper surface) 102 and a second surface (lower surface) 104 opposite to each other. The core substrate 100 may have a cavity 106 in the middle region thereof. The cavity 106 may extend from the first surface 102 to the second surface 104 of the core substrate 100.

The core substrate 100 may include a plurality of stacked insulation layers 110, 112 and the core connection wirings 120 provided in the insulation layers. A plurality of the core connection wirings 120 may be provided in the fan out region outside an area where the semiconductor chip (die) is disposed, to be used for electrical connection with the semiconductor chip mounted therein. The core connection wiring 120 may be a vertical connection structure penetrating the core substrate 100 from the first surface 102 to the second surface 104 of the core substrate 100.

For example, the core substrate 100 may include a first insulation layer 110 and a second insulation layer 112 stacked on the first insulation layer 110. The core connection wiring 120 may include a first metal wiring 122, a first contact 123, a second metal wiring 124c, a second contact 125 and a third metal wiring 126. The first metal wiring 122 may be provided in the second surface 104 of the core substrate 100, that is, a lower surface of the first insulation layer 110, and at least a portion of the first metal wiring 122 may be exposed from the second surface 104. The third metal wiring 126 may be provided in the first surface 102 of the core substrate 100, that is, an upper surface of the second insulation layer 112, and at least a portion of the third metal wiring 126 may be exposed from the first surface 102. It may be understood that the numbers and arrangements of the insulation layers and the core connection wirings of the core substrate 100 may not be limited thereto.

In some example embodiments of inventive concepts, the semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

The semiconductor chip 200 may include a substrate and chip pads 210 on an active surface, that is, a front surface 202 of the substrate. The semiconductor chip 200 may be arranged such that the front surface 202 on which the chip pads 210 of the semiconductor chip 200 are formed faces downward. Accordingly, the chip pads 210 may be exposed from the second surface 104 of the core substrate 100. The front surface 202 of the semiconductor chip 200 may be coplanar with the second surface 104 of the core substrate

100. A backside surface 204 opposite to the front surface 202 of the semiconductor chip 200 may be positioned lower than the first surface 102 of the core substrate 100. A thickness of the semiconductor chip 200 may be smaller or greater than a thickness of the core substrate 100. The thickness of the semiconductor chip 200 may be within a range of about 60 μm to 150 μm, and the thickness of the core substrate 100 may be within a range of about 50 μm to 130 μm.

In some example embodiments of inventive concepts, a sealing layer 130 may be provided on the first surface 102 of the core substrate 100 to fill the cavity 106 and expose the backside surface 204 of the semiconductor chip 200. The sealing layer 130 may have openings that expose the third metal wirings 126 of the core connection wirings 120. The backside surface 204 of the semiconductor chip 200 may be coplanar with an upper surface of the sealing layer 130. In some other example embodiments of inventive concepts, sealing layer 130 may be on and/or cover the backside surface 204 of the semiconductor chip.

The sealing layer 130 may be formed to fill the gap between sidewalls of the semiconductor chip 200 and inner sidewalls of the cavity 106. Accordingly, the sealing layer 130 may be on and/or cover sidewalls of the semiconductor chip 200, the first surface 102 of the core substrate 100 and the inner sidewall of the cavity 106.

For example, the sealing layer 130 may include a thermosetting resin such as epoxy resin, a thermoplastic resin such as polyimide, a resin including reinforcing materials such as inorganic fillers, etc. For example, the sealing layer may include an insulation film such as ABF (Ajinomoto Build-up Film), a composite material such as FR-4, a resin such as BT (Bismaleimide Triazine), etc. Alternatively, the sealing layer may include a molding material such as Epoxy Molding Compound (EMC), a photosensitive insulating material such as PIE (Photo Imageable Encapsulant), etc.

In some example embodiments of inventive concepts, the lower redistribution wiring layer 300 may be arranged on the second surface 104 of the core substrate 100 and the front surface of the semiconductor chip 200. The lower redistribution wiring layer 300 may include first redistribution wirings 302 electrically connected to the chip pads 210 of the semiconductor chip 200 and the core connection wirings 120 respectively. The first redistribution wirings 302 may be provided on the front surface 202 of the semiconductor chip 200 and the second surface 104 of the core substrate 100 to function as a front side redistribution wiring. Accordingly, the lower redistribution wiring layer 300 may be a front redistribution wiring layer of a fan out package.

In particular, the lower redistribution wiring layer 300 may include a first lower redistribution wiring layer having first lower redistribution wirings 312 provided on a first lower insulation layer 310.

The first lower insulation layer 310 may be provided on the second surface 104 of the core substrate 100 and may have first openings that expose the chip pads 210 of the semiconductor chip 200 and the first metal wirings 122 of the core connection wirings 120 respectively. The first lower redistribution wirings 312 may be provided on the first lower insulation layer 310 and portions of the first lower redistribution wirings 312 may make contact with the chip pads 210 and the first metal wirings 122 through the first openings respectively.

The lower redistribution wiring layer 300 may include a second lower redistribution wiring layer having second lower redistribution wirings 322 provided on a second lower insulation layer 320.

The second lower insulation layer 320 may be provided on the first lower insulation layer 310 and may have second openings that expose the first lower redistribution wirings 312 respectively. The second lower redistribution wirings 322 may be provided on the second lower insulation layer 320 and portions of the second lower redistribution wirings 322 may make contact with the first lower redistribution wirings 312 through the second openings respectively.

The lower redistribution wiring layer 300 may include a third lower redistribution wiring layer having third lower redistribution wirings 332 provided on a third lower insulation layer 330.

The third lower insulation layer 330 may be provided on the second lower insulation layer 320 and may have third openings that expose the second lower redistribution wirings 322 respectively. The third lower redistribution wirings 332 may be provided on the third lower insulation layer 330 and portions of the third lower redistribution wirings 332 may make contact with the second lower redistribution wirings 322 through the third openings respectively.

The lower redistribution wiring layer 300 may include a fourth lower insulation layer 340 provided on the third lower insulation layer 330 to expose portions of the third lower redistribution wirings 332. The fourth lower insulation layer 340 may serve as a passivation layer. A bump pad (not illustrated) such as UBM (Under Bump Metallurgy) may be provided on a portion of the third lower redistribution wiring 332 exposed by the fourth lower insulation layer 340. In this case, the exposed portion of the third lower redistribution wiring 332 may serve as a landing pad, that is, a package pad.

For example, the first to third lower insulation layers may include a polymer layer, a dielectric layer, etc. The first to third lower redistribution wirings may include aluminum (Al), copper (Cu), tin (Sn), nickel (Ni), gold (Au), platinum (Pt) and/or an alloy thereof. A thickness of each of the first to third lower redistribution wirings may be within a range of about 3 μm to 8 μm.

Accordingly, the lower redistribution wiring layer 300 may be provided on the front surface 202 of the semiconductor chip 200 and the second surface 104 of the core substrate 100 and may include the first redistribution wirings 302 electrically connected to the chip pads 210 and the core connection wirings 120 respectively. The lower redistribution wiring layer 300 may be on and/or cover the second surface 104 of the core substrate 100 provided in an area (fan out region) outside the semiconductor chip 200. Some of the first redistribution wirings 302 may electrically connect the chip pads 210 of the semiconductor chip 200 and the core connection wirings 120 of the core substrate 100. It may be understood that the number, sizes, arrangements, etc. of the lower insulation layers and the lower redistribution wirings of the lower redistribution wiring layer in FIG. 1 are illustrated as examples, and thus, inventive concepts may not be limited thereto.

In some example embodiments of inventive concepts, the upper redistribution wiring layer 160 may be provided on the first surface 102 of the core substrate 100 and the backside surface 204 of the semiconductor chip 200 and may include second redistribution wirings 132 electrically connected to the core connection wirings 120, bonding pads 140 disposed on redistribution pads 135 of the second redistribution wirings 132 and a solder resist layer 150 exposing at least a portion of the bonding pads 140. The second redistribution wirings 132 may be provided on the backside surface 204 of the semiconductor chip 200 and the first surface 102 of the core substrate 100 to function as a backside redistribution wiring. Accordingly, the upper redistribution wiring layer 160 may be a backside redistribution wiring layer of a fan out package.

The second redistribution lines 132 may include copper (Cu), aluminum (Al), tin (Sn), nickel (Ni), gold (Au), platinum (Pt), and/or an alloy thereof.

In some example embodiments of inventive concepts, the upper redistribution wiring layer 160 may include first and second upper redistribution wirings stacked in at least two levels. In this case, the second redistribution wirings 132 may correspond to the first upper redistribution, and although it is not illustrated in the figures, the second upper redistribution may be an uppermost second redistribution wiring among the second redistribution wirings. At this time, the bonding pad may be formed on the second upper redistribution wiring.

The second redistribution wiring 132 may include a redistribution via 133, a redistribution line 134 (see FIG. 9) and a redistribution pad 135. The redistribution via 133 may be formed to penetrate through the sealing layer 130. The redistribution line 134 may be provided on the sealing layer 130.

The redistribution pad 135 may have a first diameter D1. For example, the first diameter D1 of the redistribution pad 135 may be within a range of about 300 μm to 350 μm. The redistribution pad 135 may have a first thickness T1. The first thickness T1 of the redistribution pad 135 may be within a range of about 5 μm to 15 μm.

In some example embodiments of inventive concepts, the bonding pad 140 may include first, second and third plating patterns 142, 144 and 146 sequentially stacked on the redistribution pad 135.

A diameter of the first plating pattern 142 may gradually decrease toward the top. A lower portion of the first plating pattern 142 may have a larger diameter than an upper portion of the first plating pattern 142. The lower portion of the first plating pattern 142 may have a diameter the same as the diameter D1 of the redistribution pad 135. The lower portion of the first plating pattern 142 may be formed to be on and/or cover the entire top surface of the redistribution pad 135.

The first plating pattern 142 may include a base portion 142a having a diameter D2 smaller/less than the diameter D1 of the redistribution pad 135 and an edge portion 142b protruding from the base portion 142a to at least partially surround an outer surface of the base portion 142a. The edge portion 142b may have an inclined sidewall S so as to have a diameter that gradually decreases toward the top.

For example, the first plating pattern 142 may have a second thickness T2. The second thickness T2 of the first plating pattern 142 may be within a range of about 0.5 μm to 4 μm. A width L1 of the edge portion 142b may be within a range of about 10 μm to 20 μm. A height L2 of the edge portion 142b may be within a range of about 0.5 μm to 2 μm. The first plating pattern 142 may include a material the same as the redistribution pad 135. The first plating pattern 142 may include copper (Cu).

The second plating pattern 144 may be provided on the first plating pattern 142. A diameter of the second plating pattern 144 may be the same as the diameter of the upper portion of the first plating pattern 142. For example, the second plating pattern 144 may include nickel (Ni).

The second plating pattern 144 may have a third thickness T3 greater than the second thickness T2. The third thickness T3 of the second plating pattern 144 may be within a range of about 3 μm to 7 μm. A diameter of the second plating pattern 144 may be within a range of about 270 μm to 330 μm.

The third plating pattern 146 may be provided on the second plating pattern 144. A diameter of the third plating pattern 146 may be the same as the diameter of the second plating pattern 144. For example, the third plating pattern 146 may include gold (Au).

The third plating pattern 146 may have a fourth thickness T4 smaller than the third thickness T3. The fourth thickness T4 of the third plating pattern 146 may be smaller than or equal to the second thickness T2. The fourth thickness T4 of the third plating pattern 146 may be within a range of about 0.3 μm to 1 μm.

The solder resist layer 150 may be provided on the sealing layer 130 to be on and/or cover the second redistribution wirings 132 and may have an opening 152 that exposes at least a portion of the bonding pad 140. The solder resist layer 150 may serve as a passivation layer. For example, the solder resist layer 150 may include an insulating film such as ABF which may be the same material used for the sealing layer 130.

In some example embodiments of inventive concepts, the outer connection members 400 may be provided on the package pads on the outer surface of the lower redistribution wiring layer 300 respectively. For example, the outer connection member 400 may include a solder ball. The solder ball may have a diameter in the range of about 300 μm to 500 μm. The semiconductor package 10 may be mounted on a module substrate (not illustrated) via the solder balls to provide a memory module.

As mentioned above, the semiconductor package 10 as the fan-out panel level package may include the upper redistribution wiring layer 160 on/covering the upper surface 102 of the core substrate 100 and including the sealing layer on/covering the semiconductor chip 200, the second redistribution wirings 132 on the sealing layer 130 to be electrically connected to the conductive structures 120 and the bonding pads 140 disposed on the redistribution pads 135 of the second redistribution wirings 132.

The bonding pad 140 may include the first, second and third plating patterns 142, 144 and 146 sequentially stacked on the redistribution pad 135 as shown in FIG. 2. The diameter of the first plating pattern 142 may gradually decrease toward the top. The diameter of the lower portion of the first plating pattern 142 may be the same as the diameter of the upper portion of the redistribution pad 135. The lower portion of the first plating pattern 142 may be formed on/covering the entire upper surface of the redistribution pad 135.

Accordingly, the upper surface of the redistribution pad 135 under the third plating pattern 146 including gold (Au) may be covered by the first plating pattern 142. Thus, undercut in the redistribution pad 135 due to galvanic corrosion may be reduced and/or prevented during an etching operation performed after forming the bonding pad.

Figure 3:
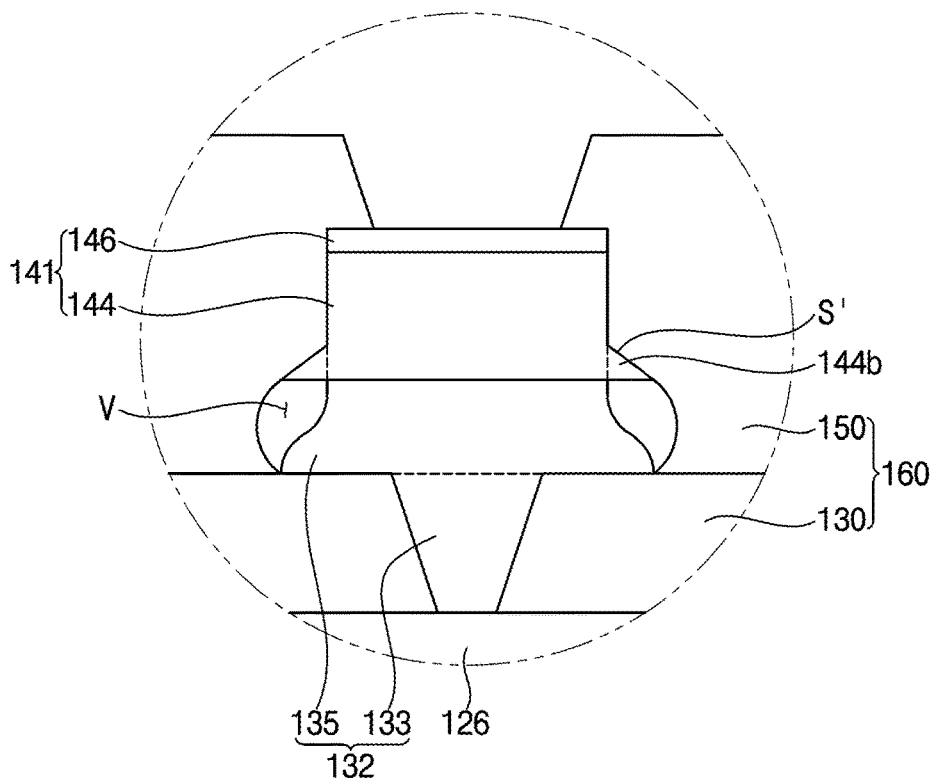

FIG. 3 is an enlarged cross-sectional view illustrating portion 'A' in FIG. 1 according to a comparative example.

Referring to FIG. 3, a bonding pad 141 according to comparative example does not have a first plating pattern 142 (see FIG. 2) and may include second and third plating patterns 144 and 146. A lower portion of the second plating pattern 144 including nickel (Ni) may have a foot-like shape. That is, an edge portion 144b of the second plating pattern 144 may have an inclined sidewall S to have a diameter that gradually decreases toward the top. Because a lower portion of the second plating pattern 144 may be formed on/covering the entire upper surface of the redistribution pad 135, in the etching operation performed after forming the bonding pad, a portion of the redistribution pad 135 under the foot-like portion including nickel (Ni) may be etched to be relatively reduced so that an undercut is formed in the redistribution pad 135 by galvanic corrosion, and a void (V) may be formed between the solder resist layer 150 and the redistribution pad 135.

Hereinafter, a method of manufacturing the semiconductor package in FIG. 1 will be explained.

FIGS. 4 to 17 illustrate operations of a method of manufacturing a semiconductor package in accordance with some example embodiments of inventive concepts. FIG. 4 is a plan view illustrating a panel having a plurality of core substrates formed therein. FIGS. 5 to 8, 10, 16 and 17 are cross-sectional views taken along the line I-I' in FIG. 4. FIGS. 11 and 13 to 15 are enlarged cross-sectional views illustrating portion 'B' in FIG. 10 taken along the line I-I' in FIG. 4. FIG. 9 is a plan view illustrating a second redistribution wiring in FIG. 8.

Referring to FIGS. 4 to 7, first, a panel P having a plurality of core substrates 100 formed therein may be prepared, a semiconductor chip 200 may be arranged in a cavity 106 of the core substrate 100, and then, a sealing layer 130 may be formed on/covering the semiconductor chip 200.

In some example embodiments of inventive concepts, the core substrate 100 may be used as a support frame or a base substrate for electrical connection for manufacturing a semiconductor package having a fan-out panel level package configuration.

As illustrated in FIG. 4, the panel P may include a frame region FR on which the core substrate 100 is formed and a scribe lane region, that is, cutting region CA at least partially surrounding the frame region FR. As described later, the panel P may be sawed along the cutting region CA dividing the frame regions FR to form an individual core substrate 100.

The core substrate 100 may have a first surface 102 and a second surface 104 opposite to each other. The core substrate 100 may have the cavity 106 in a middle region of the frame region FR. As described later, the cavity 106 may have an area configured to receive at least one semiconductor chip.

The core substrate 100 may include a plurality of stacked insulation layers 110, 112 and core connection wirings 120 provided in the insulation layers. A plurality of the core connection wirings 120 may be provided to penetrate through the core substrate 100 from the first surface 102 to the second surface 104 of the core substrate 100 to function as an electrical connection path. For example, the core connection wirings 120 may be provided in a fan out region outside an area where the semiconductor chip (die) is disposed to be used for electrical connection. For example, the core connection wiring 120 may include a first metal wiring 122, a first contact 123, a second metal wiring 124, a second contact 125 and a third metal wiring 126.

Figure 5:
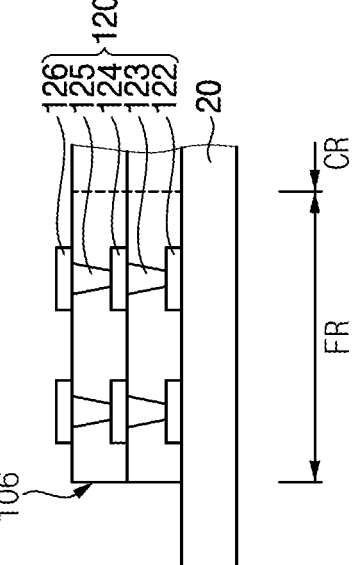
Figure 5:
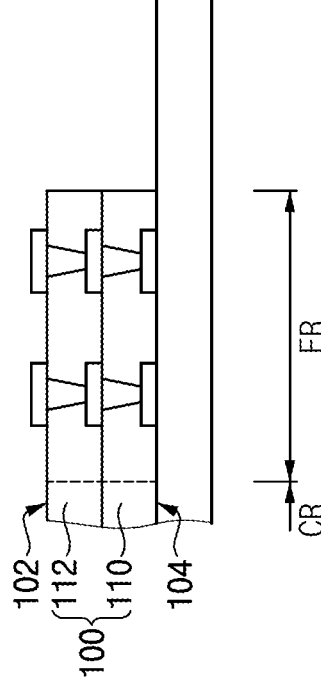

As illustrated in FIG. 5, the panel P may be arranged on a barrier tape 20, and then the at least one semiconductor chip 200 may be arranged within the cavity 106.

The second surface 104 of the core substrate 100 may be adhered on the barrier tape 20 on a first carrier substrate (not illustrated). For example, in the range of about 200 to about 6,000 dies (chips) may be arranged in the cavities 106 of the panel P respectively. As described later, a singulation operation may be performed to saw the panel P to complete a fan-out panel level package. Alternatively, a plurality of semiconductor chips 200 may be arranged within one cavity 106.

Figure 6:
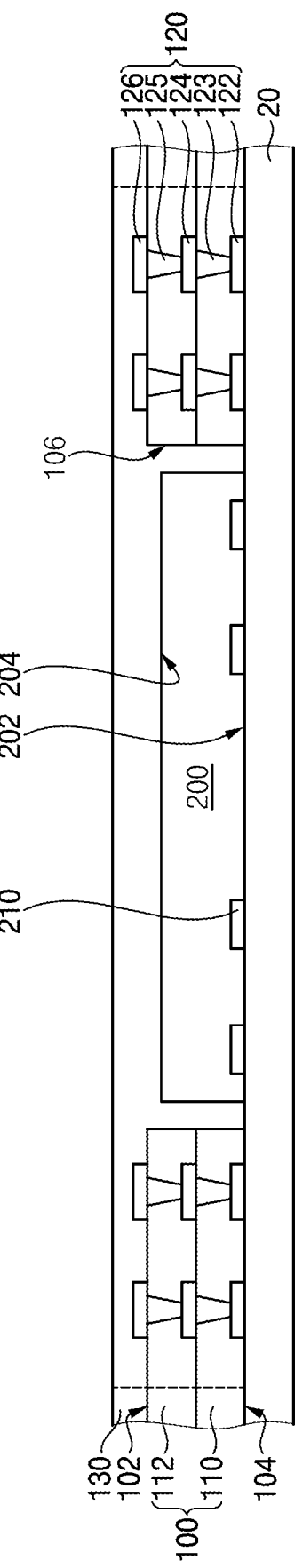

As illustrated in FIG. 6, the semiconductor chip 200 may include a substrate and chip pads 210 on an active surface, which is a front surface 202 of the substrate. In some embodiments of inventive concepts, transistors of the semiconductor chip 200 may be formed in a region adjacent to the active surface of the substrate. The semiconductor chip 200 may be arranged such that the front surface on which the chip pads 210 are formed faces downward toward the barrier tape 20. The front surface 202 of the semiconductor chip 200 may be coplanar with the second surface 104 of the core substrate 100.

The semiconductor chip 200 may be disposed within the cavity 106 of the core substrate 100. A sidewall of the semiconductor chip 200 may be spaced apart from an inner sidewall of the cavity 106. Accordingly, gaps may be formed between the sidewall of the semiconductor chip 200 the inner sidewalls of the cavity 106.

A thickness of the semiconductor chip 200 may be smaller than a thickness of the core substrate 100. Accordingly, a backside surface 204 of the semiconductor chip 200 may be positioned lower than the first surface 102 of the core substrate 100. Alternatively, the thickness of the semiconductor chip 200 may be equal to or greater than the thickness of the core substrate 100. In this case, the backside surface 204 of the semiconductor chip 200 may be coplanar with or higher than the first surface 102 of the core substrate 100.

As illustrated in FIG. 6, the sealing layer 130 may be formed on the first surface 102 of the core substrate 100, for example, to cover the semiconductor chip 200. The sealing layer 130 may be formed to fill the gaps between sidewalls of the semiconductor chip 200 and inner sidewalls of the cavity 106. Accordingly, the sealing layer 130 may be on and/or cover the backside surface 204 of the semiconductor chip 200, the first surface 102 of the core substrate 100 and the inner sidewalls of the cavity 106.

For example, the sealing layer 130 may include a thermosetting resin such as epoxy resin, a thermoplastic resin such as polyimide, a resin including reinforcing materials such as inorganic fillers, etc. In particular, the sealing layer may include an insulation film such as ABF (Ajinomoto Build-up Film), a composite material such as FR-4, a resin such as BT (Bismaleimide Triazine), etc. The sealing layer may include a molding material such as Epoxy Molding Compound (EMC), a photosensitive insulating material such as PID (Photo Imageable Dielectric), etc. When the sealing layer 130 includes an insulating film such as ABF, the sealing layer 130 may be formed using a lamination operation.

Figure 7:
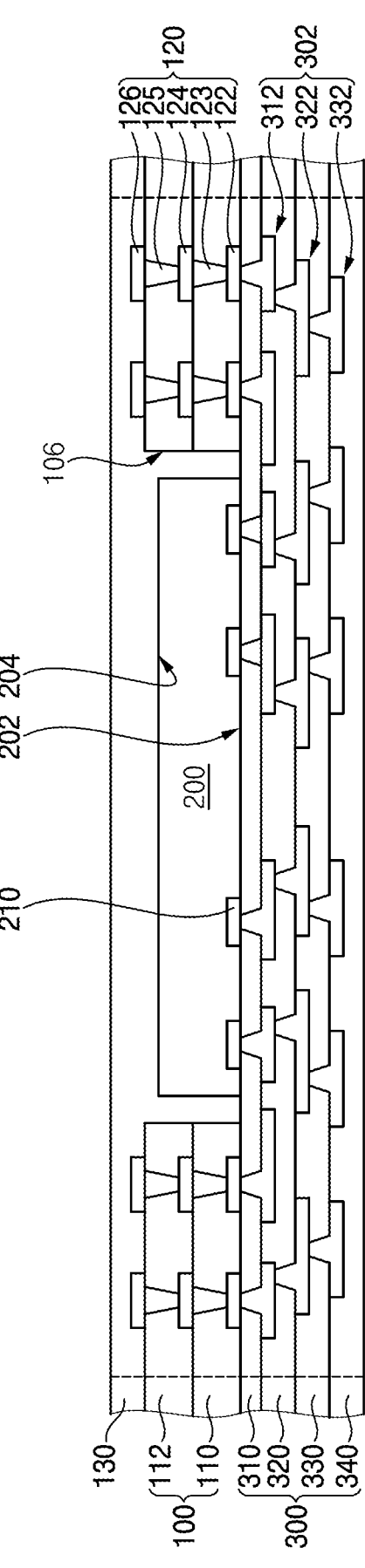

Referring to FIG. 7, a lower redistribution wiring layer 300 may be formed on the second surface 104 of the core substrate 100 and the front surface 202 of the semiconductor chip 200. The lower redistribution wiring layer 300 including first redistribution wirings 302 electrically connected to the chip pads 210 of the semiconductor chip 200 and the core connection wirings 120 respectively may be formed on the second surface 104 of the core substrate 100 and the front surface 202 of the semiconductor chip 200. The lower redistribution wiring layer 300 may be a front redistribution wiring layer of a fan out package.

In particular, after removing the barrier tape 20, the structure in FIG. 6 may be reversed, and the sealing layer 130 may be adhered on a second carrier substrate (not illustrated). Then, a first lower insulation layer 310 may be formed on the second surface 104 of the core substrate 100 and the front surface 202 of the semiconductor chip 200, and then, the first lower insulation layer 310 may be patterned to form first openings that expose the chip pads 210 of the semiconductor chip 200 and the first metal wirings 122 of the core connection wiring 120 respectively.

For example, the first lower insulation layer 310 may include a polymer layer, a dielectric layer, etc. The first lower insulating layer 310 may include a photosensitive insulating material (PID) or an insulating film such as ABF. The first lower insulation layer may be formed using a vapor deposition operation, a spin coating operation, etc.

Then, first lower redistribution wirings 312 may be formed on the first lower insulation layer 310. The first lower redistribution wirings 312 may make contact with the chip pads 210 and the first metal wirings 122 through the first openings respectively.

In some example embodiments of inventive concepts, the first lower redistribution wiring 312 may be formed on portions of the first lower insulation layer 310, the chip pads 210 and the first metal wirings 122. The first lower redistribution wiring may be formed by forming a seed layer on a portion of the first lower insulation layer 310 and in the first opening, patterning the seed layer and performing an electro plating operation. Accordingly, at least portions of the first lower redistribution wirings 312 may make contact with the chip pads 210 and the first metal wirings 122 through the first openings.

For example, the first lower redistribution wiring may include aluminum (Al), copper (Cu), tin (Sn), nickel (Ni), gold (Au), platinum (Pt) and/or an alloy thereof.

Similarly, a second lower insulation layer 320 may be formed on the first lower insulation layer 310, and then, the second lower insulation layer 320 may be patterned to form second openings that expose the first lower redistribution wirings 312 respectively. Then, second lower redistribution wirings 322 may be formed on the second lower insulation layer 320. The second lower redistribution wirings 322 may make contact with the first lower redistribution wirings 312 through the second openings respectively.

Then, a third lower insulation layer 330 may be formed on the second lower insulation layer 320, and then, the third lower insulation layer 330 may be patterned to form third openings that expose the second lower redistribution wirings 322 respectively. Then, third lower redistribution wirings 332 may be formed on the third lower insulation layer 330. Then, a fourth lower insulation layer 340 may be formed on the third lower insulation layer 330, for example, to cover the third lower redistribution wirings 332.

The fourth lower insulation layer 340 may serve as a passivation layer. The fourth lower insulation layer 340 may be partially removed using an opening forming operation to expose portions of the third lower redistribution wirings 332. Additionally, a bump pad such as UBM (Under Bump Metallurgy) may be formed on the portion of the third lower redistribution wiring 332 exposed by the fourth lower insulation layer 340.

The fourth lower insulating layer may include a photosensitive insulating material (PID) or an insulating film such as ABF. The fourth lower insulating layer may include a material that is the same as or different from the first to third lower insulating layers.

Figure 8:
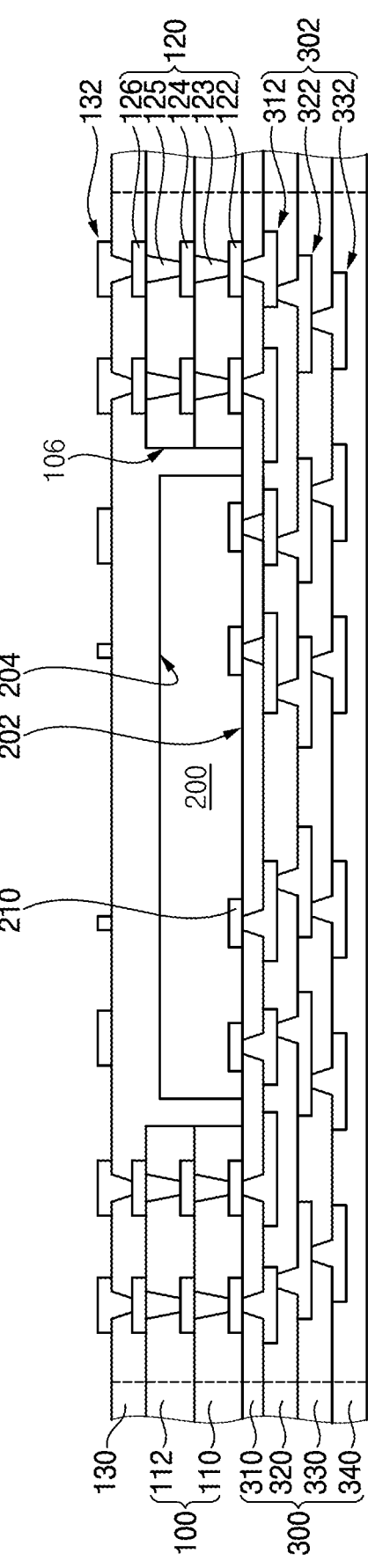
Figure 9:
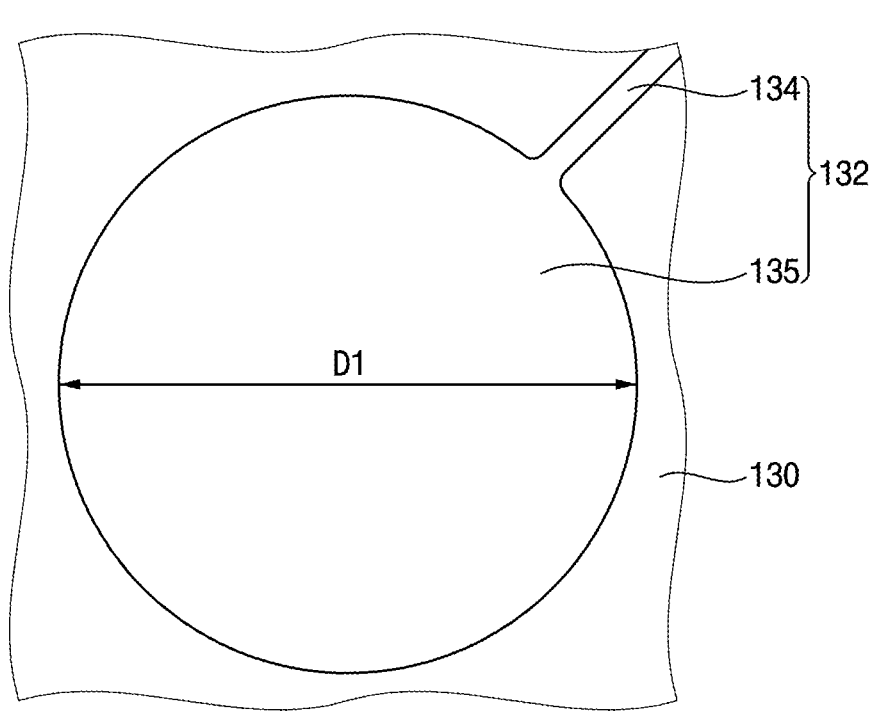

Referring to FIGS. 8 and 9, second redistribution wirings 132 may be formed on the first surface 102 of the core substrate 100 and the sealing layer 130 on the backside surface 204 of the semiconductor chip 200.

In particular, the second carrier substrate may be removed, and then, the lower redistribution wiring layer 300 may be adhered on a third carrier substrate. Then, the sealing layer 130 on the first surface 102 of the core substrate 100 may be partially removed to form openings exposing the third metal wirings 126 of the core connection wiring 120, and then the second redistribution wirings 132 may be formed on the sealing layer 130. The second redistribution wiring 132 may be electrically connected to the core connection wirings 120 through the openings. For example, the second redistribution may include copper (Cu), aluminum (Al), tin (Sn), nickel (Ni), gold (Au), platinum (Pt), and/or an alloy thereof.

Although it is not illustrated in the figures, after forming an insulating layer on the sealing layer 130, the insulating layer and the sealing layer 130 may be partially removed to form the openings. The insulating layer may include an insulating film such as ABF, which is a material that is the same as or similar to the sealing layer 130. Accordingly, the second redistribution wirings 132 may be more easily formed on the insulating layer.

In some example embodiments of inventive concepts, the second redistribution wirings 132 may include first and second upper redistribution wirings stacked in at least two levels. In this case, the second redistribution wirings 132 may correspond to the first upper redistribution, and although it is not illustrated in the figures, the second upper redistribution may be an uppermost second redistribution wiring among the second redistribution wirings. A bonding pad may be formed on the second upper redistribution wiring using the following operation(s).

As illustrated in FIG. 9, the second redistribution wiring 132 may include a redistribution via 133 (see FIG. 11), a redistribution line 134 and a redistribution pad 135. The redistribution via 133 may be formed to penetrate through the sealing layer 130. The redistribution line 134 may be formed to extend on the sealing layer 130. The redistribution pad 135 may be formed at one end portion of the redistribution line 134.

The redistribution pad 135 may have a first diameter D1. For example, the first diameter D1 of the redistribution pad 135 may be within a range of about 300 μm to 350 μm. The redistribution pad 135 may have a first thickness T1 (see FIG. 11). The first thickness T1 of the redistribution pad 135 may be within a range of about of 5 μm to 15 μm.

Referring to FIGS. 10 to 15, bonding pads 140 may be formed on the redistribution pads 135 respectively.

Figure 10:
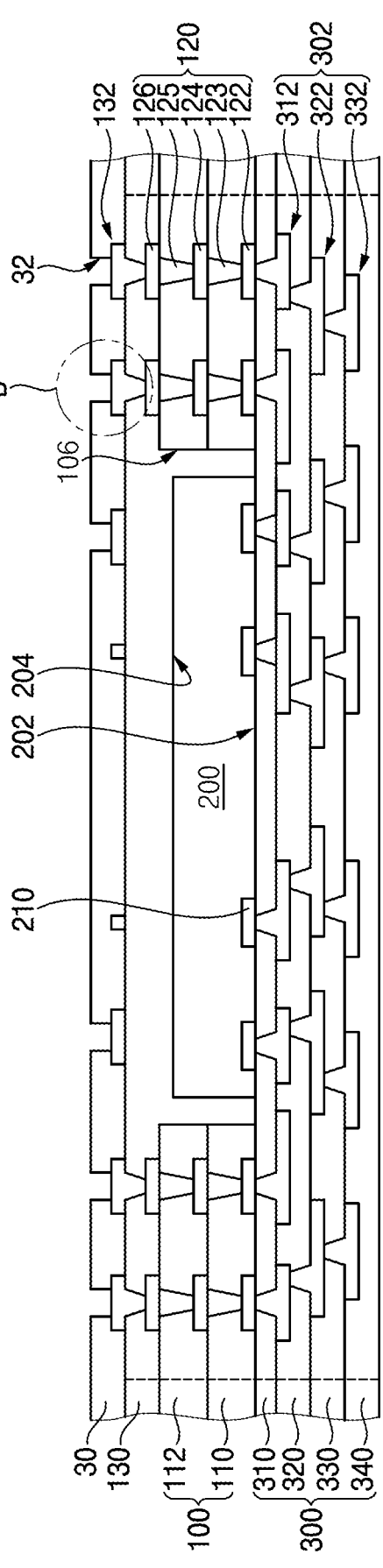
Figure 11:
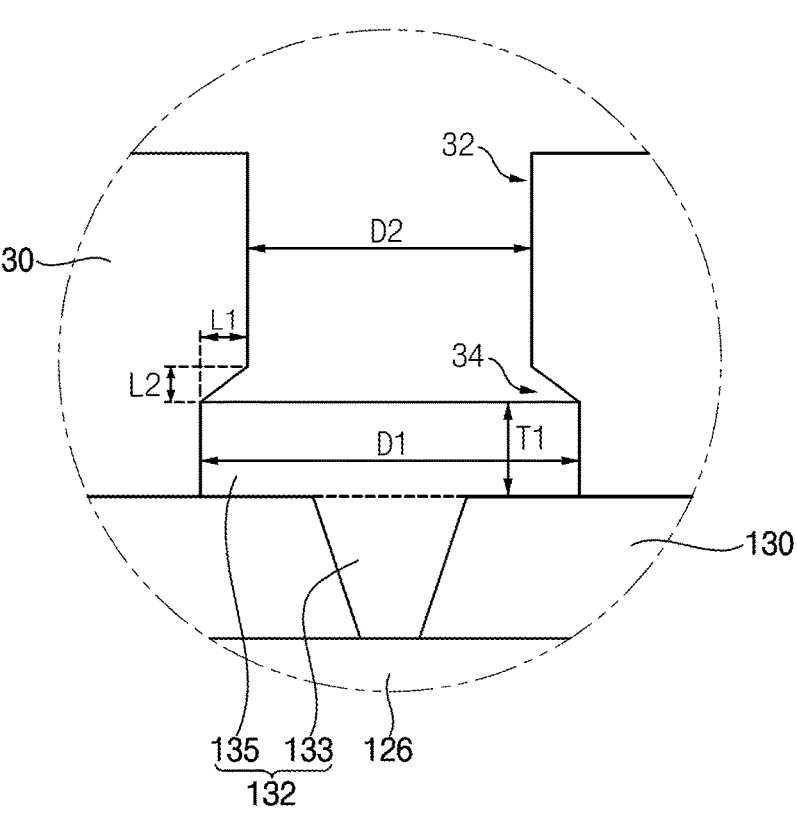
Figure 12:
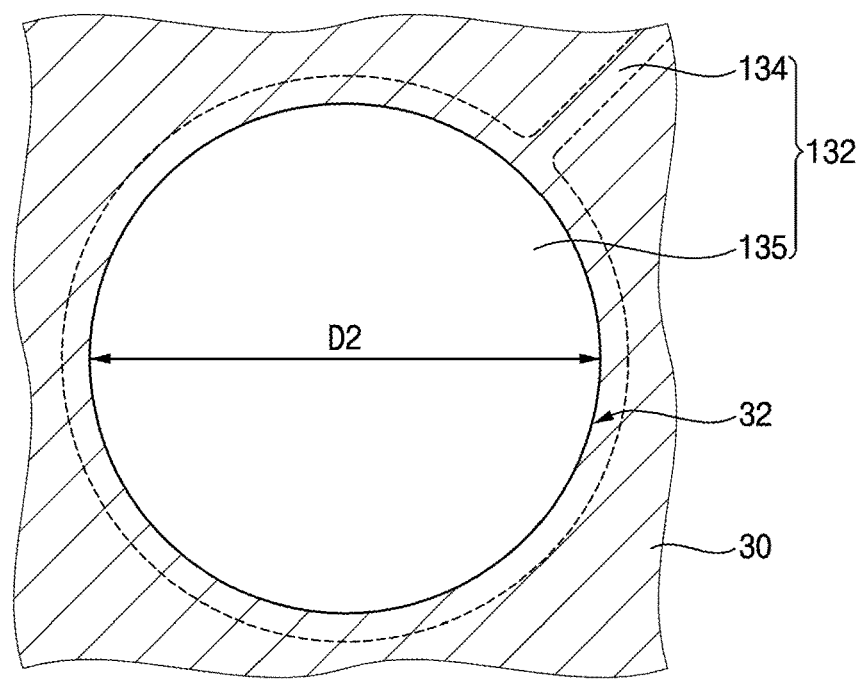

As illustrated in FIGS. 10 to 12, a photosensitive film 30 may be formed on the entire surface of the sealing layer 130 and redistribution wiring 132 (including redistribution pads 135), and the photosensitive film 30 may be patterned to form openings 32 that expose the redistribution pad 135s.

In some example embodiments of inventive concepts, the photosensitive film 30 may include dry film resist (DRF). The photosensitive film 30 may be formed using a lamination operation. A mask pattern having openings that expose regions where the bonding pads are to be formed may be formed on the dry film resist film on the sealing layer 130, and portions of the dry film resist film may be removed using a development operation to form the openings 32 that expose the regions.

A thickness of the photosensitive film 30 may be within a range of about 40 μm to 60 μm. A diameter D2 of the opening 32 may be within a range of about 270 μm to 330 μm. When viewed in plan view, a distance L1 between an outer surface of the redistribution pad 135 and an inner wall of the opening 32 may be within a range of about 15 μm to 20 μm.

At this time, the dry film resist layer may be relatively thick and may have poor adhesion to the redistribution pads 135 including copper (Cu). Accordingly, when the opening 32 is formed using the development operation, the dry film resist on a peripheral region of each of the redistribution pads 135 may lift off to form a space 34 like a bird's beak.

As shown in FIG. 11, a width L1 of the space 34 may be within a range of about 15 μm to 20 μm. A height L2 of the space 34 may be within a range of about 0.5 μm to 2 μm.

Figure 13:
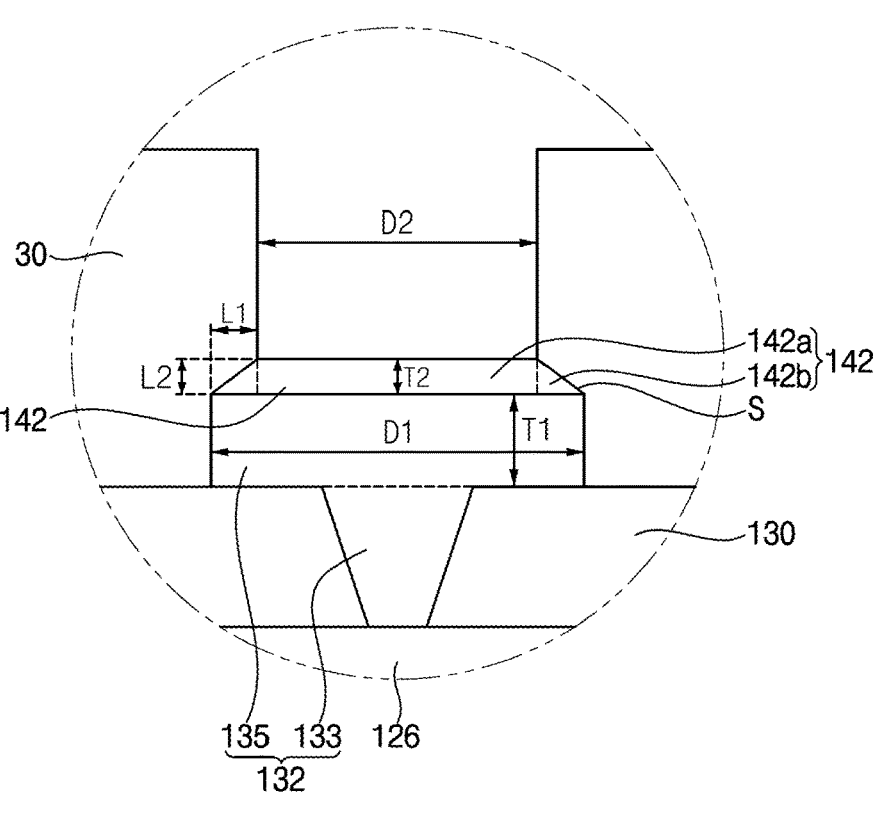

As illustrated in FIG. 13, an electro plating operation may be performed to form a first plating pattern 142 in each opening 32 on the respective redistribution pad 135. The first plating pattern 142 may be formed to fill the space 34 of the opening 32. An edge portion of the first plating pattern 142 may have a shape corresponding to the shape of the space 34 such as a bird's beak. A diameter of the first plating pattern 142 may gradually decrease toward the top. A lower portion of the first plating pattern 142 may have a larger diameter than an upper portion of the first plating pattern 142. The lower portion of the first plating pattern 142 may have a diameter the same as the diameter D1 of the redistribution pad 135.

The first plating pattern 142 may include a base portion 142a having a diameter D2 that is less than the diameter D1 of the redistribution pad 135 and an edge portion 142b protruding from the base portion 142a to at least partially surround an outer surface of the base portion 142a. The edge portion 142b may have an inclined sidewall S so as to have a diameter that gradually decreases toward the top.

For example, the first plating pattern 142 may have a second thickness T2. The second thickness T2 of the first plating pattern 142 may be within a range of about 0.5 μm to 4 μm. A width L1 of the edge portion 142b may be within a range of about 10 μm to 20 μm. A height L2 of the edge portion 142b may be within a range of about 0.5 μm to 2 μm.

The first plating pattern 142 may include a material that is the same as the redistribution pad 135. The first plating pattern 142 may include copper (Cu). The lower portion of the first plating pattern 142 may be formed on and/or to cover the entire top surface of the redistribution pad 135 to serve as an undercut reduction/prevention pad that reduces/prevents undercut due to galvanic corrosion of the redistribution pad 135 during a subsequent etching operation.

Figure 14:
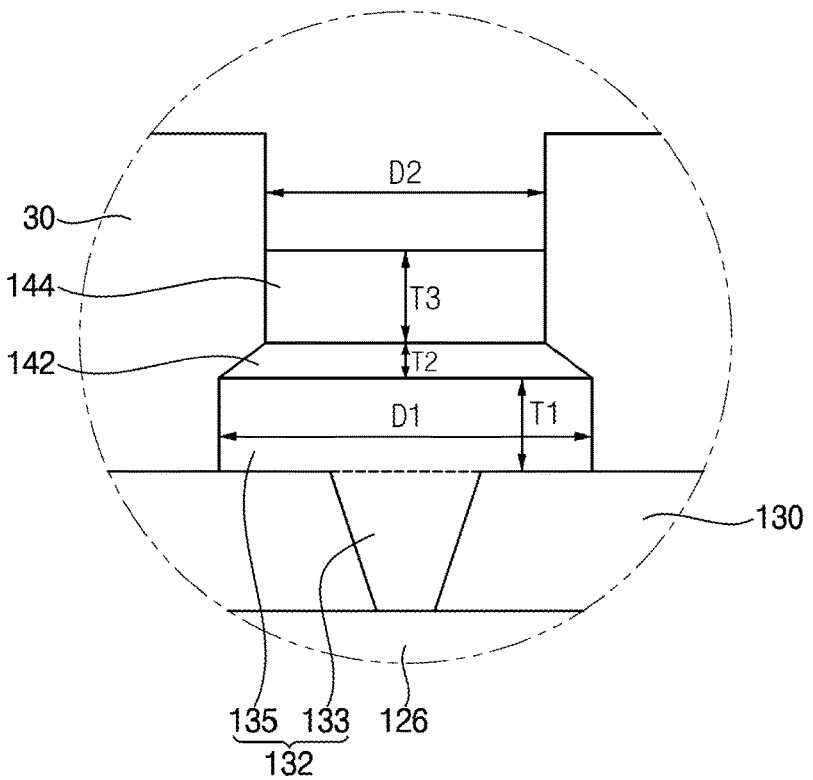

Referring to FIG. 14, an electro plating operation may be performed form a second plating pattern 144 in the opening 32 on the first plating pattern 142. The second plating pattern 144 may include a material that serves as a diffusion barrier between a solder alloy and the redistribution pad 135 in a subsequent soldering operation. For example, the second plating pattern 144 may include nickel (Ni).

The second plating pattern 144 may have a third thickness T3 greater than the second thickness T2. The third thickness T3 of the second plating pattern 144 may be within a range of about 3 μm to 7 μm. A diameter of the second plating pattern 144 may be within a range of about 270 μm to 330 μm.

Figure 15:
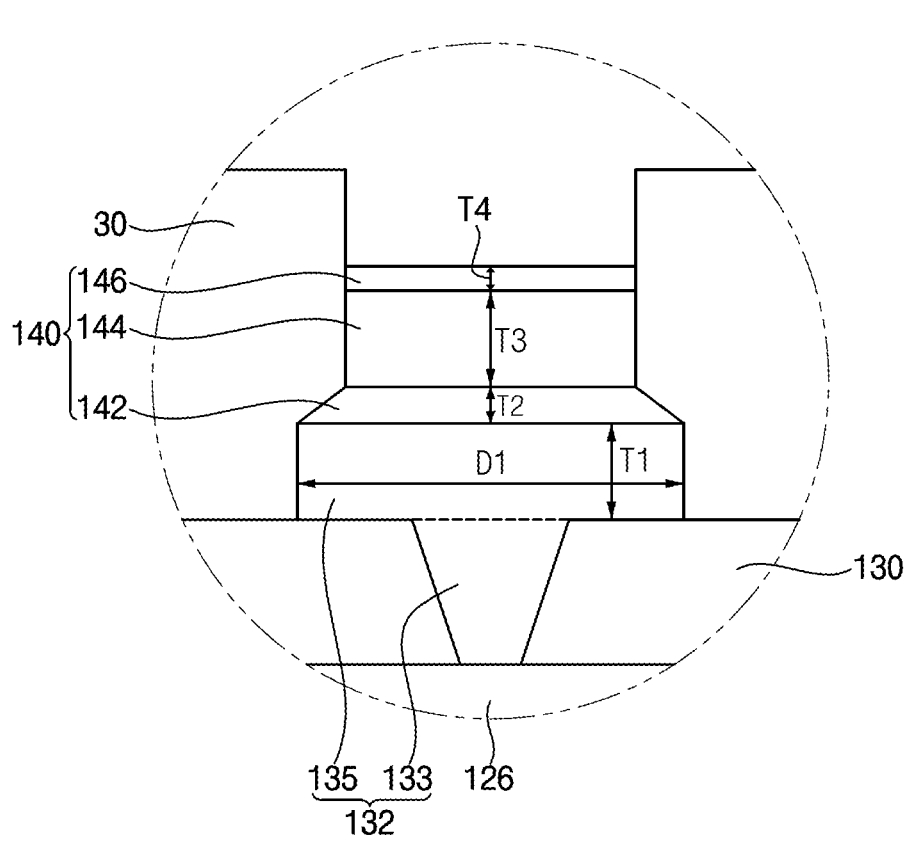

As illustrated in FIG. 15, an electrolytic plating operation may be performed to form a third plating pattern 146 in the opening 32 on the second plating pattern 144. The third plating pattern 146 may include a material provided to wet with a solder material in a subsequent soldering operation. For example, the third plating pattern 146 may include gold (Au).

The third plating pattern 146 may have a fourth thickness T4 smaller than the third thickness T3. The fourth thickness T4 of the third plating pattern 146 may be smaller than or equal to the second thickness T2. The fourth thickness T4 of the third plating pattern 146 may be within a range of about 0.3 μm to 1 μm.

Thus, the bonding pad 140 including the first, second and third plating patterns 142, 144 and 146 may be sequentially formed/stacked on the redistribution pad 135 of the second redistribution 132.

Figure 16:
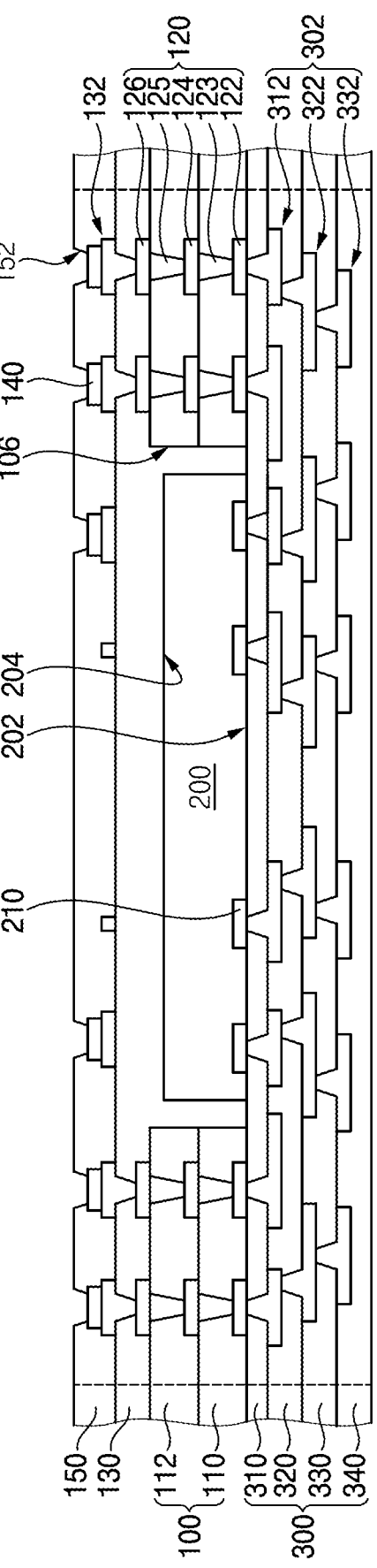

Referring to FIG. 16, the photosensitive film 30 may be removed from the sealing layer 130, an etching operation may be performed on the sealing layer 130 on which the bonding pads 140 are formed, and a solder resist layer 150 may be formed on and/or to cover the second redistribution wirings 132 and expose at least a portion of each bonding pad 140.

The etching operation may be performed to etch a seed layer used in the electro plating operation and/or to remove a seed layer used to form the bump pads such as UBM (under bump metallurgy) on the front redistribution wiring layer. An upper surface of each redistribution pad 135 under the third plating pattern 146 including gold (Au) may be covered by the first plating pattern 142. Accordingly, it may be possible to reduce and/or prevent undercutting of the redistribution pad 135 due to galvanic corrosion during the etching operation.

The solder resist layer 150 may serve as a passivation layer. For example, the solder resist layer 150 may include an insulating film such as ABF which may be the same as the material used for the sealing layer 130. A diameter of an opening 152 of the solder resist layer 150 that exposes the bonding pad 140 may be within a range of about 220 μm to 270 μm.

Accordingly, an upper redistribution wiring layer may be formed on/covering the first surface 102 of the core substrate and including the sealing layer 130, the second redistribution wirings 132, the bonding pads 140 and the solder resist layer 150.

Figure 17:
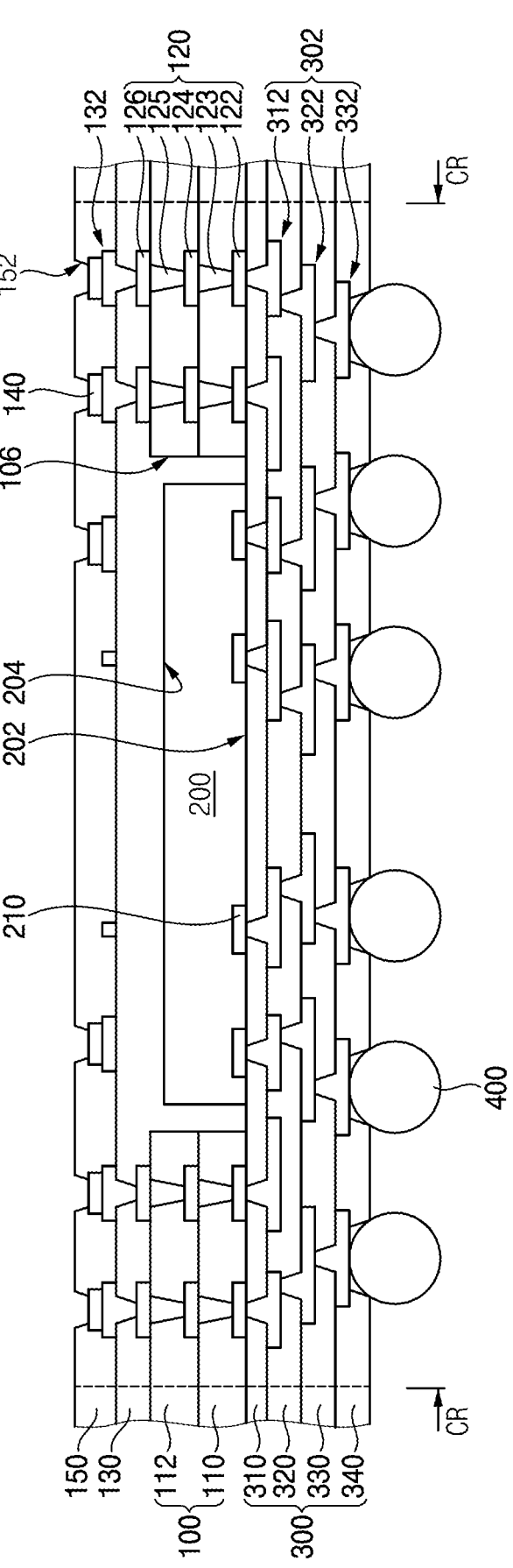

Referring to FIG. 17, outer connection members 400 may be formed on an outer surface of the lower redistribution wiring layer 300 to be electrically connected to the first redistribution wirings 302 respectively.

For example, solder balls may be provided as the outer connection members on portions of the third lower redistribution wiring 332. In this case, the portion of the third lower redistribution wiring 332 may serve as a landing pad, that is, a package pad. Thus, semiconductor manufacturing operations may be performed to form the lower redistribution wiring layer 300 having fan-out type solder ball landing pads.

Then, a sawing operation may be performed on the core substrate 100 to form an individual fan-out panel level package including the core substrate 100, the lower redistribution wiring layer 300 formed on the lower surface of the core substrate 100 and the upper redistribution wiring layer 350 formed on the upper surface of the core substrate 100.

Figure 18:
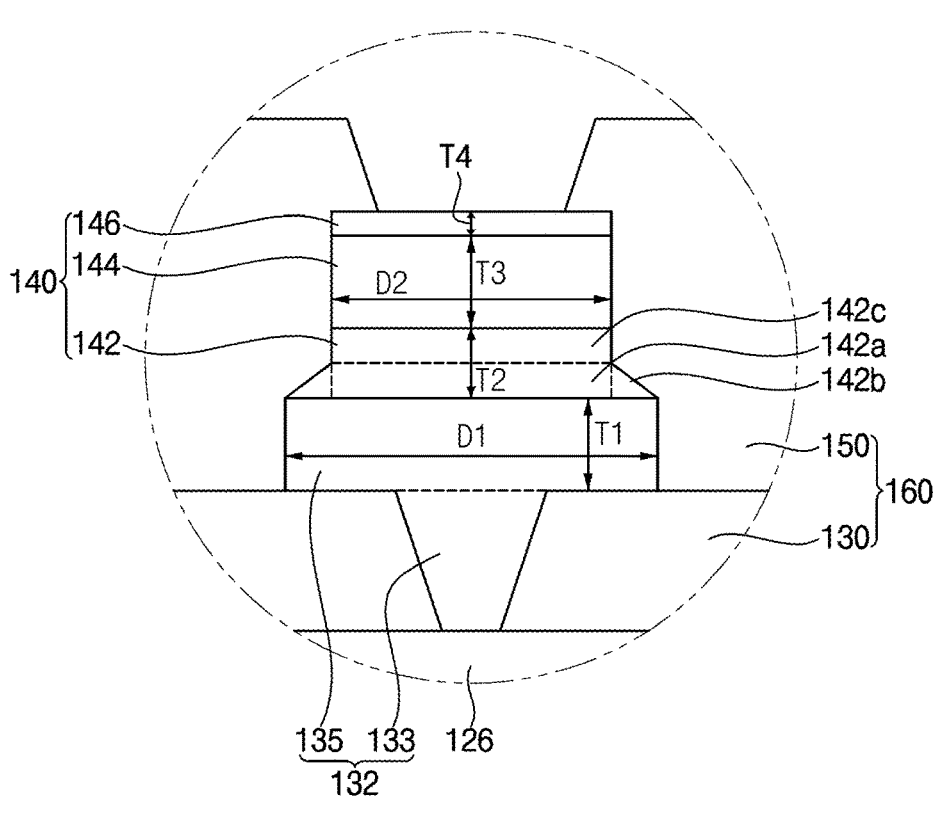

FIG. 18 is a cross-sectional view illustrating a bonding pad in accordance with some example embodiments of inventive concepts.

Referring to FIG. 18, a first plating pattern 142 of a bonding pad 140 may include a base portion 142*a* having a diameter D2 smaller than a diameter D1 of a redistribution pad 135, an edge portion 142*b* protruding to at least partially surround an outer surface of the base portion 142*a* and having an inclined side wall, and a head portion 142*c* provided on the base portion 142*a* and having a diameter the same as the diameter D2 of the base portion 142*a*.

Figure 19:
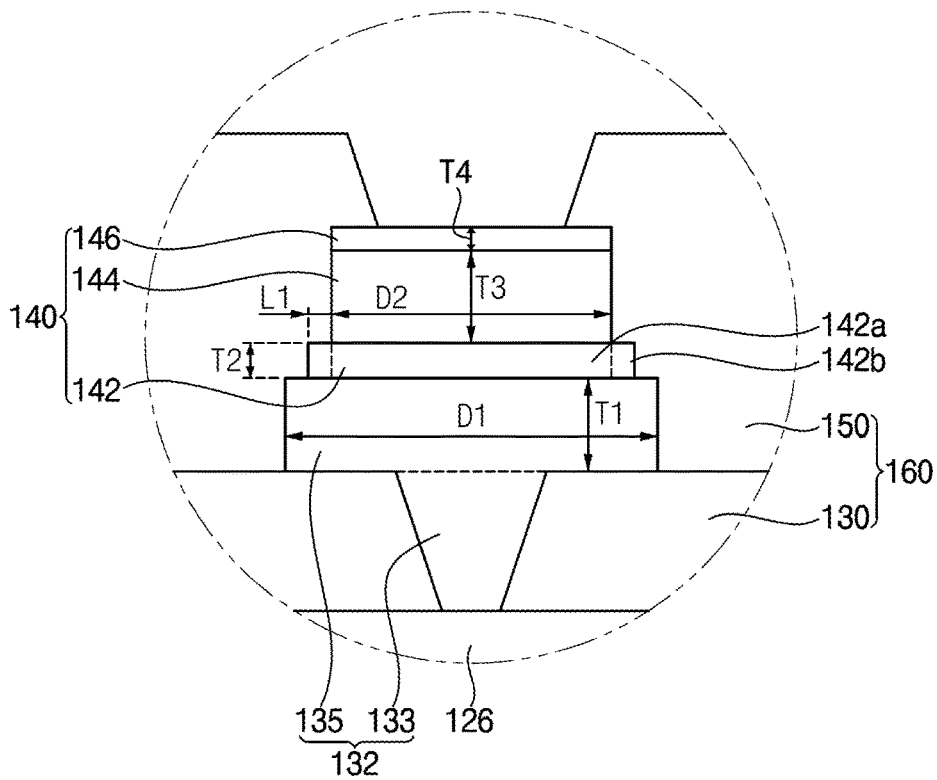

FIG. 19 is a cross-sectional view illustrating a bonding pad in accordance with some example embodiments of inventive concepts.

Referring to FIG. 19, a first plating pattern 142 of a bonding pad 140 may include a base portion 142*a* having a diameter D2 smaller than a diameter D1 of a redistribution pad 135 and an edge portion 142*b* protruding to at least partially surround an outer surface of the base portion 142*a*.

An outer diameter of the edge portion 142*b* may be smaller than the diameter D1 of the redistribution pad 135. The edge portion 142*b* may have a rectangular or trapezoidal cross-sectional shape. The edge portion 142*b* having the rectangular cross-sectional shape may have a vertical sidewall. The edge portion 142*b* having the trapezoidal cross-sectional shape may have an inclined sidewall.

Figure 20:
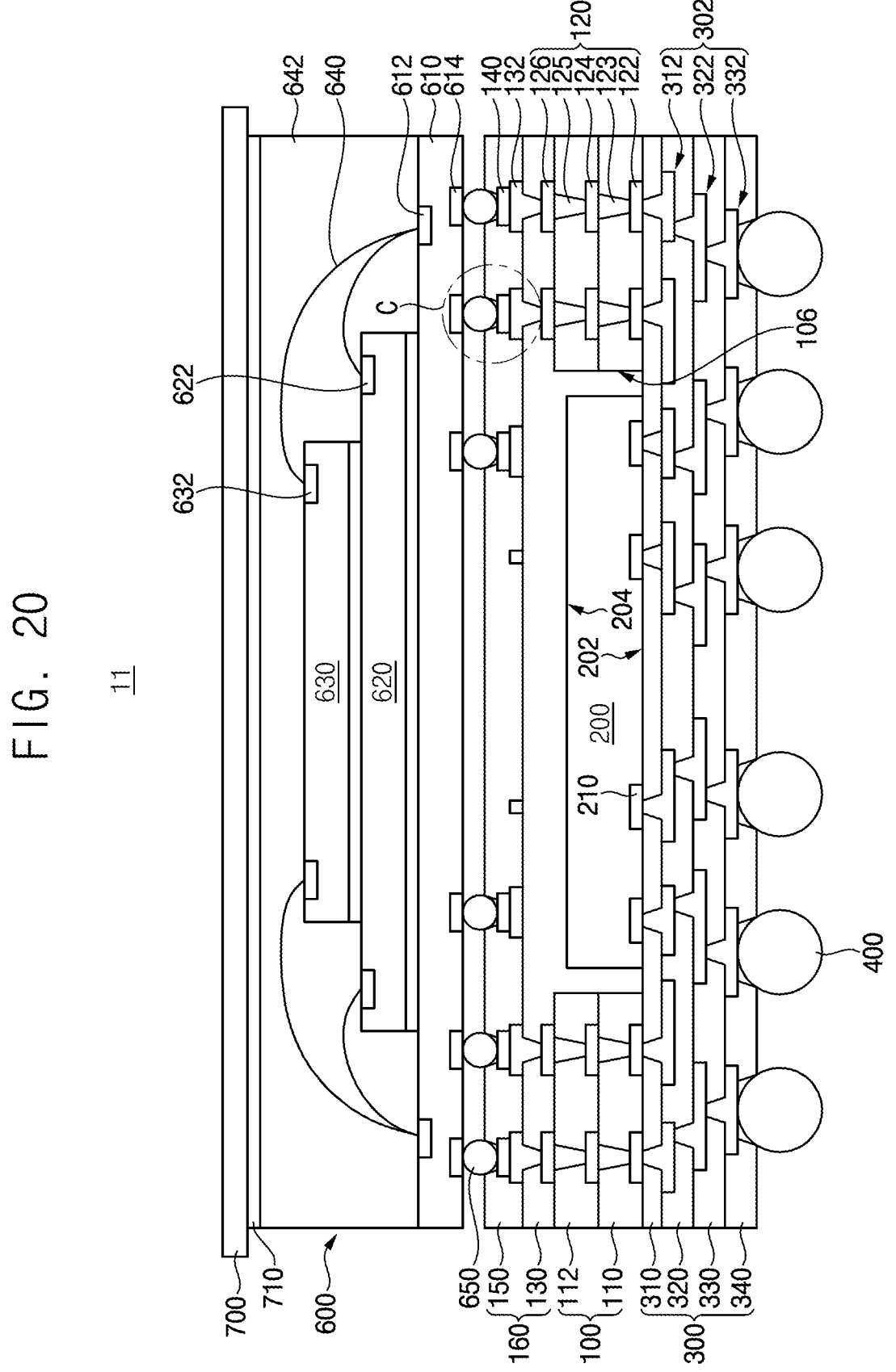
Figure 21:
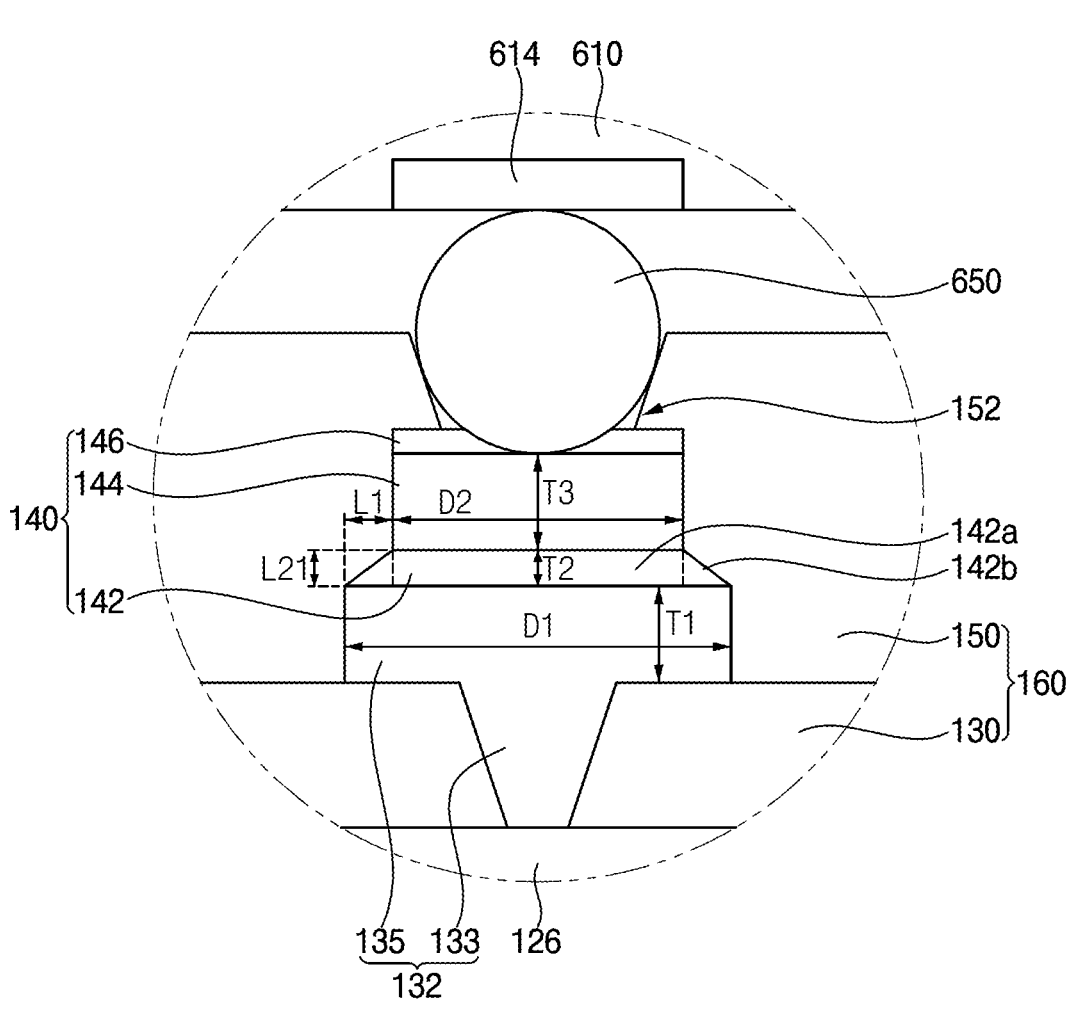

FIG. 20 is a cross-sectional view illustrating a semiconductor package in accordance with some example embodiments of inventive concepts. FIG. 21 is an enlarged cross-sectional view illustrating portion 'C' in FIG. 20. The semiconductor package may be substantially the same as or similar to the semiconductor package described with reference to FIG. 1 except for an additional second package. Thus, same reference numerals will be used to refer to the same or like elements and any further repetitive explanation concerning the above elements will be omitted for the sake of conciseness.

Referring to FIGS. 20 and 21, a semiconductor package 11 may include a first package and a second package 600 stacked on the first package. The semiconductor package 11 may further include a heat sink 700 stacked on the second package 600. The first package may include a core substrate 100, a semiconductor chip 200, a lower redistribution wiring layer 300 and an upper redistribution wiring layer 160. The first package may be substantially the same as or similar to the unit package described with reference to FIG. 1.

In some example embodiments of inventive concepts, the second package 600 may be stacked on the first package via conductive connection members 650.

The second package 600 may include a second package substrate 610, second and third semiconductor chips 620, 630 mounted on the second package substrate 610, and a molding member 642 on the second package substrate 610, for example, to cover the second and third semiconductor chips 620, 630.

The second package 600 may be stacked on the first package via the conductive connection members 650. For example, the conductive connection members 650 may include solder balls, conductive bumps, etc.

As illustrated in FIG. 21, each conductive connection member 650 may be arranged between a bonding pad 140 of the upper redistribution wiring layer 160 and a second bonding pad 614 of the second package substrate 610. Accordingly, the first package and the second package 600 may be electrically connected to each other using the conductive connection members 650.

The second and third semiconductor chips 620, 630 may be stacked on the second package substrate 610 using adhesive members. Bonding wires 640 may electrically connect chip pads 622, 632 of the second and third semiconductor chips 620, 630 to first bonding pads 612 of the second package substrate 610. The second and third semiconductor chips 620, 630 may be electrically connected to the second package substrate 610 using the bonding wires 640.

Although the second package 600 including two semiconductor chips mounted in a wire bonding manner are illustrated in FIG. 20, it may be understood that the number, the mounting manner, etc. of the semiconductor chips of the second package may not be limited thereto.

In some example embodiments of inventive concepts, the heat sink 700 may be provided on the second package 600 to dissipate heat from the first and second packages to the outside. The heat sink 700 may be adhered on the second package 600 using a thermal interface material (TIM) 710.

Figure 22:
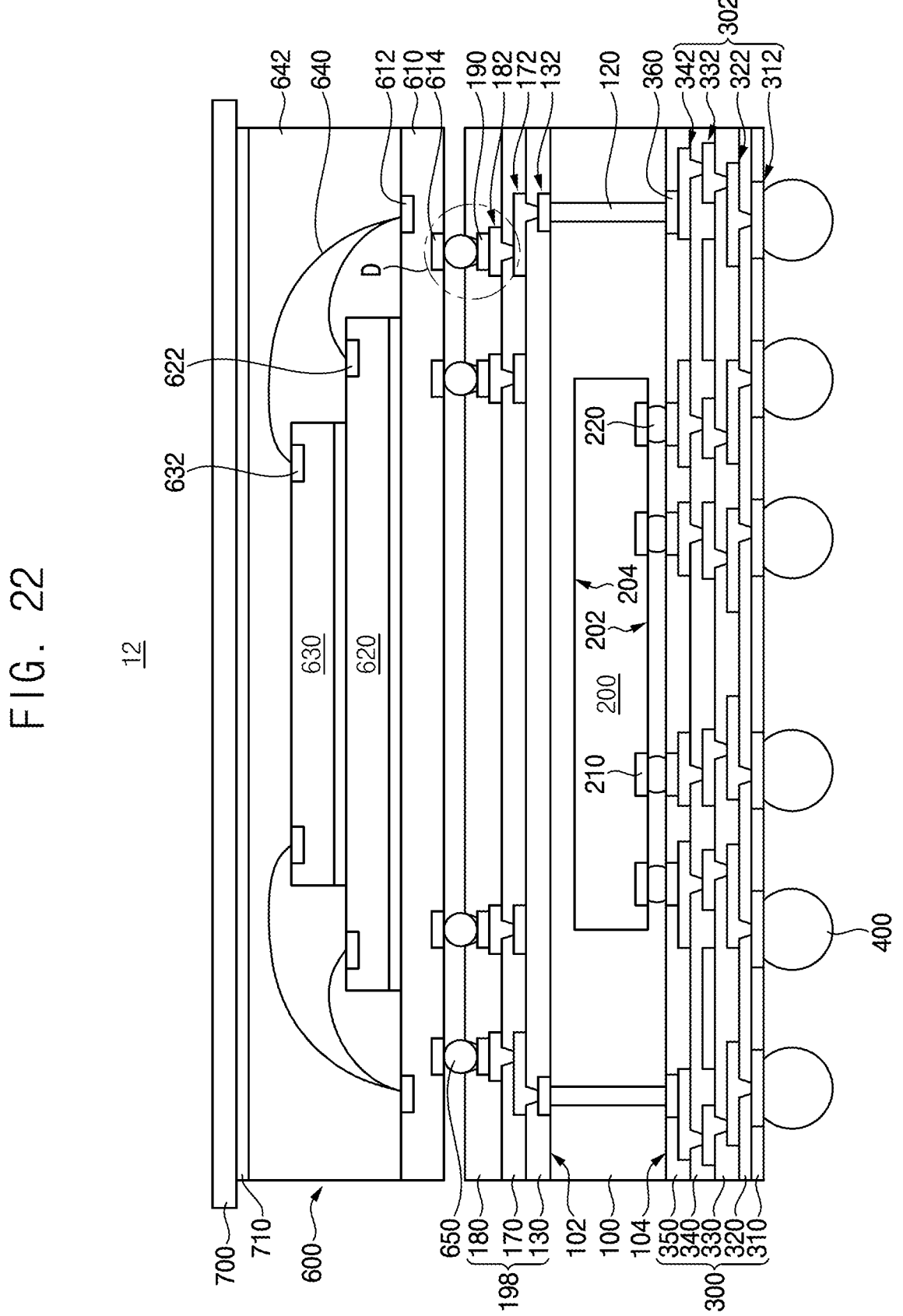
Figure 23:
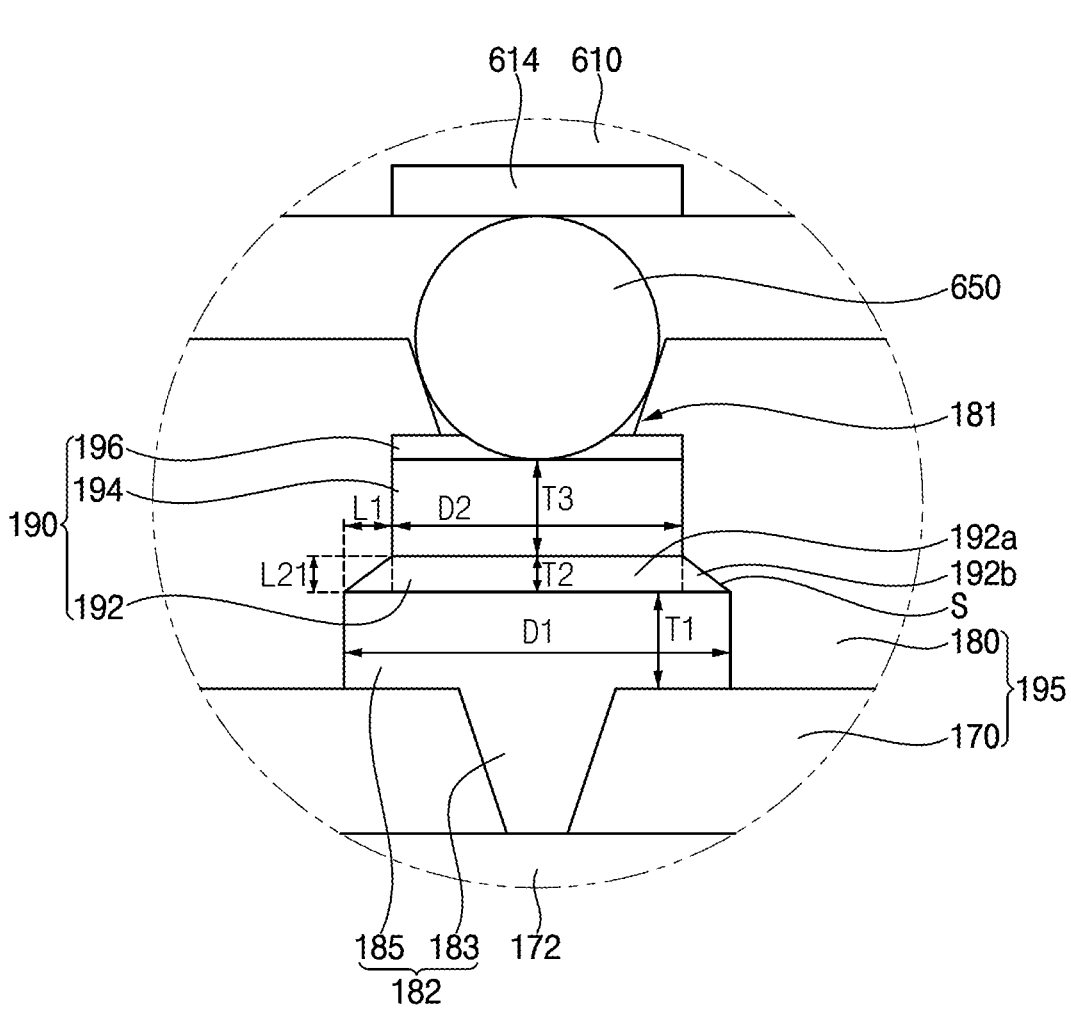

FIG. 22 is a cross-sectional view illustrating a semiconductor package in accordance with some example embodiments of inventive concepts. FIG. 23 is an enlarged cross-sectional view illustrating portion 'D' in FIG. 22. The semiconductor package may be substantially the same as or similar to the semiconductor package described with reference to FIG. 20 except for configurations of a base substrate and a lower redistribution wiring layer. Thus, same reference numerals will be used to refer to the same or like elements and any further repetitive explanation concerning the above elements will be omitted for the sake of conciseness.

Referring to FIGS. 22 and 23, a semiconductor package 12 may include a lower redistribution wiring layer 300, at least one semiconductor chip 200 disposed on the lower redistribution wiring layer 300, a sealing member 100 on the lower redistribution wiring layer 300 on/covering the at least one semiconductor chip 200, and an upper redistribution wiring layer 198 disposed on the sealing member 100. In addition, the semiconductor package 12 may further include outer connection members 400 disposed on an outer surface of the lower redistribution wiring layer 300.

In some example embodiments of inventive concepts, the lower redistribution wiring layer 300 may include a plurality of first redistribution wirings 302. The first redistribution wirings 302 may be electrically connected to chip pads 210 of the semiconductor chip 200 and conductive structures 120, respectively. The first redistribution wirings 302 may be provided on a front surface 202 of the semiconductor chip 200 and a lower surface 104 of the sealing member 100 to serve as front redistribution wirings. Accordingly, the lower redistribution wiring layer 300 may be a front redistribution wiring layer of a fan-out package.

For example, the lower redistribution wiring layer 300 may include first to fifth lower insulation layers 310, 320, 330, 340 and 350 sequentially stacked. The first redistribution wirings 302 may include first to fourth lower redistribution wirings 312, 322, 332 and 342 provided in the first to fifth lower insulation layers 310, 320, 330, 340 and 350.

The lower redistribution wiring layer 300 may include a first bonding pad 360 formed on the fourth lower redistribution 342 as an uppermost first redistribution wiring. For example, the first bonding pad 360 may have a structure the same as or similar to a second bonding pad 190 as described later.

The fifth lower insulation layer 350 may be provided on the fourth lower insulation layer 340 on/covering the fourth lower redistribution wirings 342 and may have an opening that expose at least a portion of the first bonding pad 190. The fifth lower insulation layer 350 may include a solder resist layer serving as a passivation layer. Accordingly, the first bonding pads 360 may be exposed from an upper surface of the lower redistribution wiring layer 300.

In some example embodiments of inventive concepts, the semiconductor chip 200 may be arranged on the lower redistribution wiring layer 300. The semiconductor chip 200 may be mounted on the lower redistribution wiring layer 300 by a flip chip bonding method. In this case, the semiconductor chip 200 may be mounted on the lower redistribution wiring layer 300 such that an active surface on which chip pads 210 are formed faces the lower redistribution wiring layer 300. The chip pads 210 of the semiconductor chip 200 may be electrically connected to the first bonding pads 360 of the lower redistribution wiring layer 300 using conductive bumps 220 as conductive connection members. For example, the conductive bumps 220 may include micro bumps (uBumps).

In this embodiment, a structure in which the chip pads 210 of the semiconductor chip 200 are electrically connected to the first bonding pads 360 of the lower redistribution wiring layer 300 by the conductive bumps 220 is exemplarily illustrated, however, it may not be limited thereto. For example, the chip pads 210 of the semiconductor chip 200 may be directly connected to the first bonding pads 360 of the lower redistribution wiring layer 300 without intervening conductive bumps.

In some example embodiments of inventive concepts, the conductive structures 120 may be disposed on the first bonding pads 360, and the sealing member 100 may be provided on the lower redistribution layer 300 on/covering the semiconductor chip 200 and the conductive structures 120. The sealing member 100 may include a plurality of through holes through which the conductive structures 120 extend. One end portion of the conductive structure 120 in the through hole may be connected to the first bonding pad 360 of the lower redistribution wiring layer 300 and another end portion of the conductive structure 120 may be exposed from the upper surface 102 of the sealing member 100.

For example, the conductive structure 120 may include a pillar shape or a bump shape. The conductive structure 120 includes nickel (Ni), antimony (Sb), bismuth (Bi), zinc (Zn), indium (In), palladium (Pd), platinum (Pt), aluminum (Al), copper (Cu), molybdenum (Mo), titanium (T1), gold (Au), silver (Ag), chromium (Cr), tin (Sn), etc.

In some example embodiments of inventive concepts, the upper redistribution wiring layer 198 may be disposed on the sealing member 100 and may include second redistribution wirings 132, 172 and 182 electrically connected to: the conductive structures 120; second bonding pads 190 disposed on redistribution pads 185 of uppermost second redistribution wiring lines 182 among the second redistribution wirings; and a solder resist layer 180 that exposes at least portions of the second bonding pads 190. The second redistribution wirings 132, 172 and 182 may be provided on a back side 204 of the semiconductor chip 200 and the upper surface 102 of the sealing member 100 to serve as backside redistribution wirings. Accordingly, the upper redistribution wiring layer may be a backside redistribution wiring layer of the fan-out package.

The uppermost second redistribution wiring 182 may include a redistribution via 183, a redistribution line and a redistribution pad 185. The redistribution via 183 may be formed to penetrate through a second upper insulating layer 170. The redistribution line may be provided on the second upper insulation layer 170.

The redistribution pad 185 may have a first diameter D1. For example, the first diameter D1 of the redistribution pad 185 may be within a range of about 300 μm to 350 μm. The redistribution pad 185 may have a first thickness T1. The first thickness T1 of the redistribution pad 185 may be within a range of about 5 μm to 15 μm.

As illustrated in FIG. 23, the second bonding pad 190 may include first, second and third plating patterns 192, 194 and 196 sequentially stacked on the redistribution pad 185.

A diameter of the first plating pattern 192 may gradually decrease toward the top. A lower portion of the first plating pattern 192 may have a larger diameter than an upper portion of the first plating pattern 192. The lower portion of the first plating pattern 192 may have a diameter the same as the diameter D1 of the redistribution pad 185. The lower portion of the first plating pattern 192 may be formed on/covering the entire upper surface of the redistribution pad 185.

The first plating pattern 192 may include a base portion 192a having a diameter D2 smaller than the diameter D1 of the redistribution pad 185 and an edge portion 192b protruding to at least partially surround an outer surface of the base portion 192a. The edge portion 192b may have an inclined sidewall S to have a diameter that gradually decreases toward the top.

The first, second and third plating patterns 192, 194 and 196 of the second bonding pad 190 may be substantially the same as or similar to detailed structures of the bonding pad 140 of FIG. 2. Thus, detailed descriptions thereof will be omitted for the sake of conciseness.

As described above, the semiconductor package 12 may include the sealing member 100, the lower redistribution wiring layer 300 formed on the lower surface of the sealing member 100, and the upper redistribution wiring layer 198 formed on the upper surface of the sealing member 100 may include a fan-out wafer level package.

In some example embodiments of inventive concepts, the semiconductor package 12 may further include a second package 600 stacked on the first package as the fan-out wafer level package. The second package 600 may be stacked via the conductive connection members 650 on the upper redistribution layer 198 of the first package.

The conductive connection members 650 may be disposed between the second bonding pads 190 of the upper redistribution wiring layer 198 and second bonding pads 614 of second package substrate 610. Accordingly, the first package and the second package 600 may be electrically connected to each other using the conductive connection members 650.

The second package may be substantially the same as or similar to the second package described with reference to FIG. 20. Thus, detailed descriptions thereof will be omitted for the sake of conciseness.

Hereinafter, a method of manufacturing the semiconductor package in FIG. 22 will be explained.

FIGS. 24 to 29 are cross-sectional views illustrating a method of manufacturing a semiconductor package in accordance with some example embodiments of inventive concepts.

Figure 24:
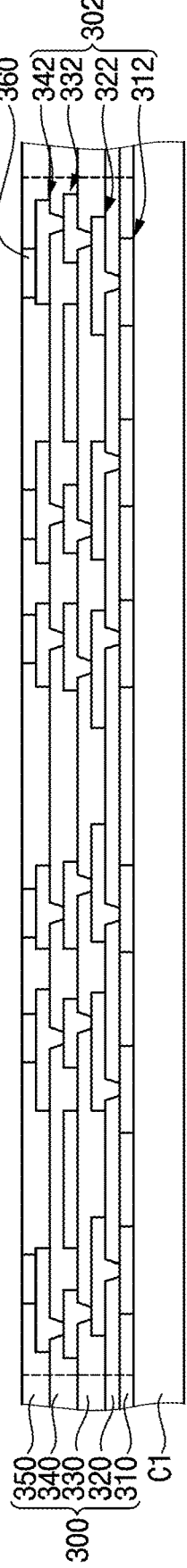

Referring to FIG. 24, a lower redistribution wiring layer 300 having first redistribution wirings 302 may be formed on a carrier substrate C1.

In some example embodiments of inventive concepts, the carrier substrate C1 may include a wafer substrate. The wafer substrate may be used as a base substrate on which a plurality of semiconductor chips are arranged and a molding member is formed on/covering the semiconductor chips. The wafer substrate may have a shape corresponding to a wafer on which semiconductor manufacturing operations are performed. For example, the carrier substrate C1 may include a silicon substrate, a glass substrate, a non-metal or metal plate, and the like.

The carrier substrate C1 may include a package region in which the semiconductor chip is mounted and a cutting region at least partially surrounding the package region. As described later, the lower redistribution wiring layer 300 and the molding member 100 formed on the wafer substrate may be cut along the cutting region dividing a plurality of package regions to be individualized.

As illustrated in FIG. 24, a plating operation may be performed on the carrier substrate C1 to form first lower redistribution wirings 312. Although it is not illustrated in the figure, after sequentially forming a barrier metal layer, a seed layer and a photoresist film on the carrier substrate C1, an exposure operation may be performed on the photoresist film to form a photoresist pattern having openings that expose first lower redistribution wiring regions. Then, the plating operation may be performed on the seed layer to form the first lower redistribution wirings. For example, the first lower redistribution wiring may include copper (Cu), aluminum (Al), tin (Sn), nickel (Ni), gold (Au), platinum (Pt), or an alloy thereof.

Then, a first lower insulation layer 310 may be formed on the carrier substrate C1 (e.g., to cover the first lower redistribution wirings 312), and then, the first lower insulation layer 310 may be patterned to form first openings that expose the first lower redistribution wirings 312 respectively.

For example, the first lower insulation layer 310 may include a polymer layer, a dielectric layer, etc. The first lower insulating layer 310 may include a photosensitive insulating material (PID) or an insulating film such as ABF. The first lower insulation layer may be formed using a vapor deposition operation, a spin coating operation, etc.

Then, a second lower insulation layer 320 may be formed on the first lower insulation layer 310, and then, second lower redistribution wirings 322 may be formed on the second lower insulation layer 320.

For example, the second lower insulation layer 320 may be formed on/covering the first lower redistribution wirings 312, and then, the second lower insulation layer 320 may be patterned to form second openings that expose the first lower redistribution wirings 312 respectively. The second lower redistribution wiring may be formed by forming a seed layer on a portion of the first lower insulation layer 310 and in the second opening, patterning the seed layer and performing an electro plating operation. Accordingly, at least portions of the second lower redistribution wirings 322 may make contact with the first lower distribution wirings 312 through the second openings.

Similarly, a third lower insulation layer 330 may be formed on the second lower insulation layer 320, and then, the third lower insulation layer 330 may be patterned to form third openings that expose the second lower redistribution wirings 322 respectively. Then, third lower redistribution wirings 332 may be formed on the third lower insulation layer 330. The third lower redistribution wirings 332 may make contact with the second lower redistribution wirings 322 through the third openings respectively.

Then, a fourth lower insulation layer 340 may be formed on the third lower insulation layer 330, and then, the fourth lower insulation layer 340 may be patterned to form fourth openings that expose the third lower redistribution wirings 332. Then, fourth lower redistribution wirings 342 may be formed on the fourth lower insulation layer 340 to directly contact the third lower redistribution wirings 332 through the fourth openings.

Then, first bonding pads 360 may be formed on the fourth lower redistribution wirings 342 respectively.

For example, a plating operation may be performed on a redistribution pad of the fourth lower redistribution wiring 342 to form the first bonding pad 360. Operations the same as or similar to the operations described with reference to FIGS. 10 to 15 may be performed to form the first bonding pad 360 on the redistribution pad of the fourth lower redistribution wiring 342. In this case, the first bonding pad 360 may include first, second, and third plating patterns sequentially stacked on the redistribution pad of the fourth lower redistribution wirings 342. A diameter of the first plating pattern may gradually decrease toward the top. A diameter of a lower portion of the first plating pattern may be greater than a diameter of an upper portion of the first plating pattern. The diameter of the lower portion of the first plating pattern may be equal to or smaller than a diameter of the redistribution pad. The lower portion of the first plating pattern may be formed on/covering the entire upper surface of the redistribution pad.

Then, a solder resist layer 350 as a fifth lower insulation layer may be formed on the fourth lower insulation layer 340 to cover the fourth lower redistribution wirings 342 and expose at least a portion of the first bonding pad 360. Accordingly, the lower redistribution wiring layer 300 having the first to fifth lower insulation layers 310, 320, 330, 340 and 350 may be formed. The first bonding pads 360 may be exposed from an upper surface of the lower redistribution layer 300.

Figure 25:
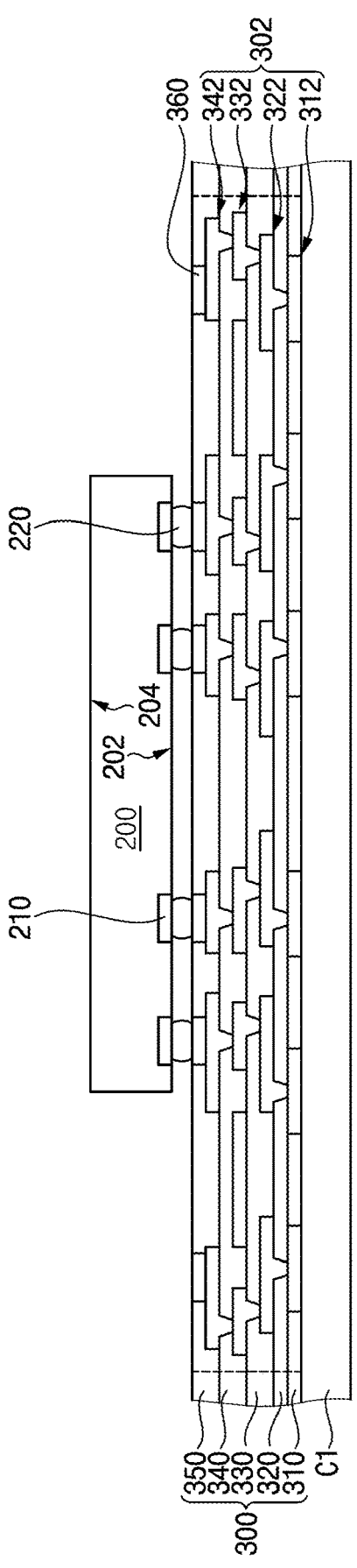

Referring to FIG. 25, a semiconductor chip 200 may be mounted on the lower redistribution wiring layer 300.

For example, the semiconductor chip 200 may be mounted on the lower redistribution wiring layer 300 using a flip chip bonding method. Chip pads 210 of the semiconductor chip 200 may be electrically connected to the first bonding pads 360 of the lower redistribution wiring layer 300 using conductive bumps 220. The conductive bumps 220 may include micro bumps (uBumps).

Figure 26:
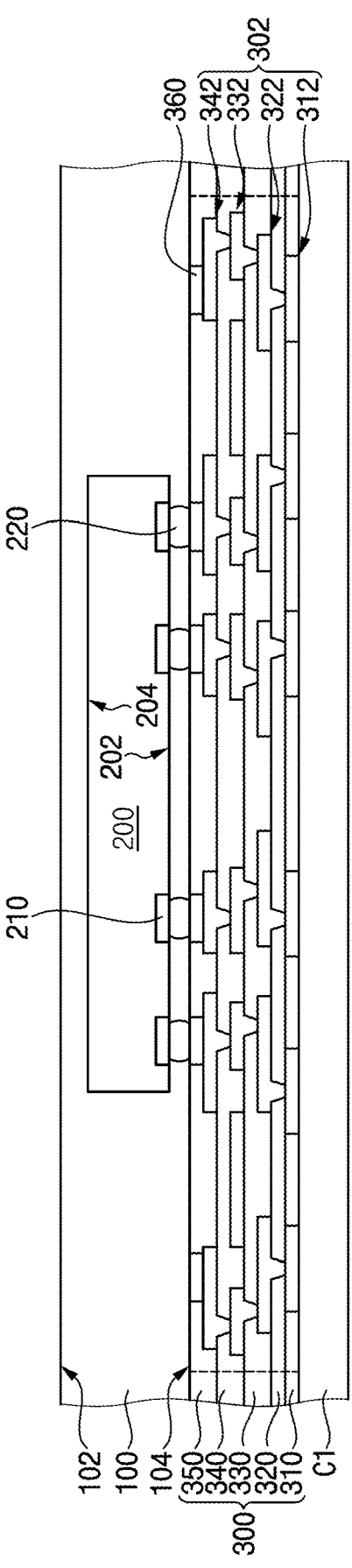
Figure 27:
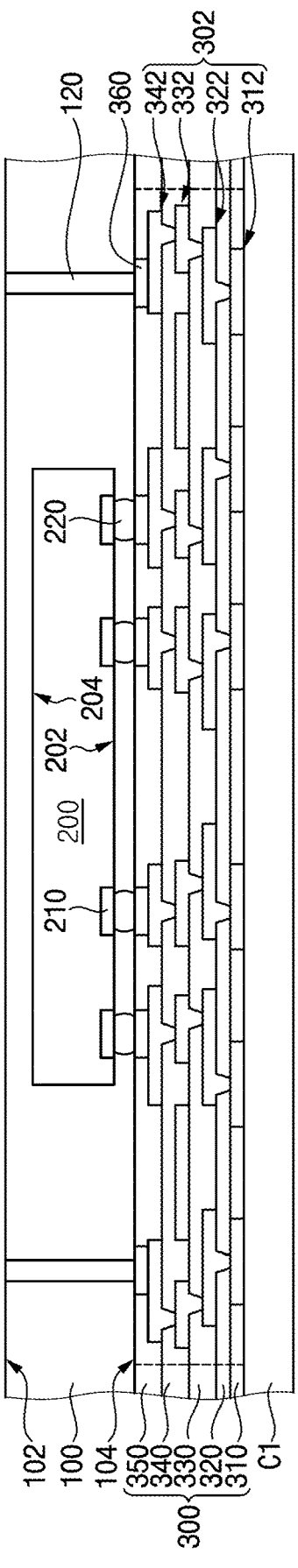

Referring to FIGS. 26 and 27, a sealing member 100 on/covering the semiconductor chip 200 may be formed on the carrier substrate C1, and a plurality of conductive structures 120 may be formed to be electrically connected to the first bonding pads 360.

As illustrated in FIG. 26, the sealing member 100 on/covering the semiconductor chip 200 may be formed on the lower redistribution wiring layer 300. For example, the sealing member 100 may include an epoxy molding compound (EMC) or an insulating film such as ABF. The sealing member 100 may be formed on/covering an upper surface and side surfaces of the semiconductor chip 200.

Then, through holes may be formed to penetrate the sealing member 100 in a vertical direction and expose upper surfaces of the first bonding pads 360, and a plurality of the conductive structures 120 may be formed in the through holes as shown in FIG. 27. The conductive structure 120 may be formed on the first bonding pad 360. An upper surface of the conductive structure 120 may be exposed from an upper surface of the sealing member 100. For example, the conductive structure 120 may be formed using an electroplating operation, an electroless plating operation, a vapor deposition operation, or the like. The conductive structure 120 may have a pillar shape or a bump shape.

Alternatively, after the conductive structures 120 are formed on the first bonding pads 360, and the sealing member may be formed on the lower redistribution wiring layer 300 to cover the semiconductor chip 200 and the conductive structures 120.

In this embodiment, after forming the lower redistribution layer 300 on the wafer substrate, the semiconductor chip 200 and the sealing member 100 may be formed on the lower redistribution layer 300. However, embodiments of inventive concepts are not limited thereto, and, for example, after stacking a semiconductor chip on a wafer substrate, a sealing member may be formed on/covering the semiconductor chip, and a lower redistribution wiring layer having first redistribution wirings electrically connected to the semiconductor chip may be formed on the sealing member.

Figure 28:
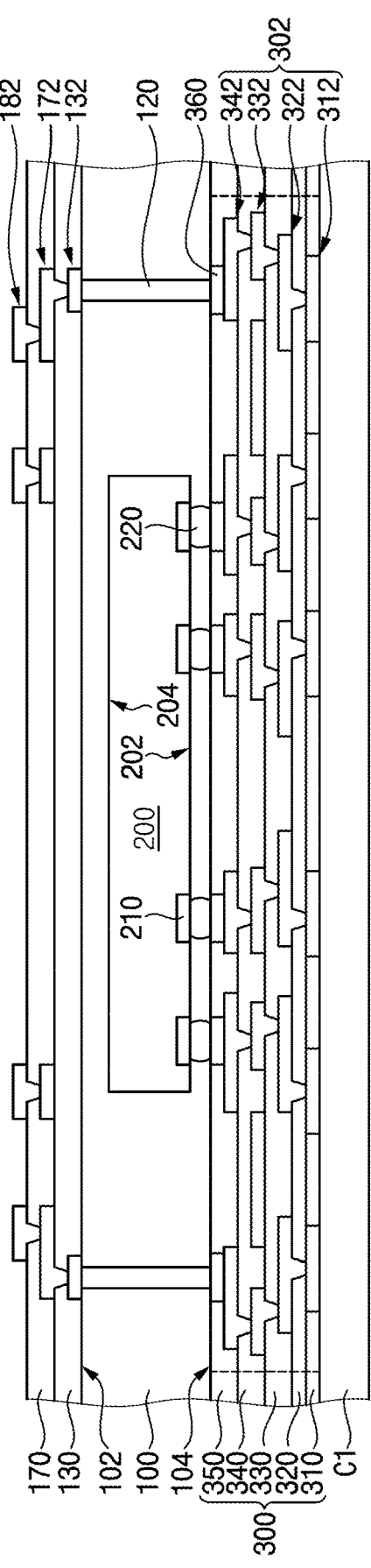
Figure 29:
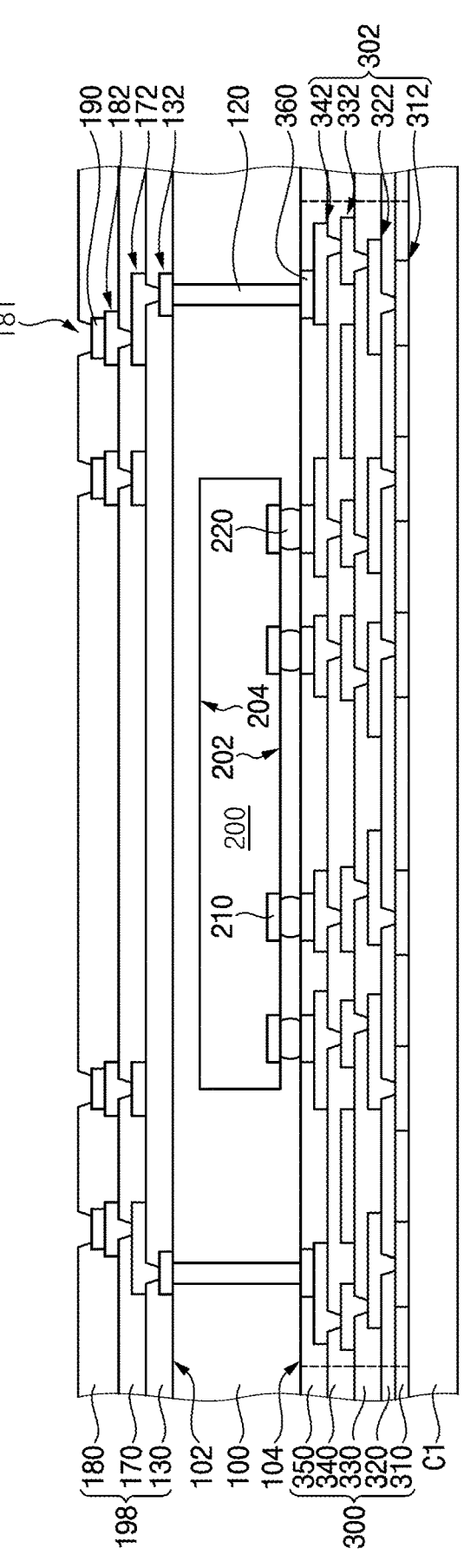

Referring to FIGS. 28 and 29, an upper redistribution wiring layer 198 having second redistribution wirings 132, 172 and 182 may be formed on the sealing member 100. Second redistribution wirings 132, 172, and 182 may be electrically connected to the conductive structures 120 and second bonding pads 190 disposed on a redistribution pad of an uppermost second redistribution wiring 182.

As illustrated in FIG. 28, first upper redistribution wirings 132 electrically connected to the conductive structures 120 may be formed on the sealing member 100. The first upper redistribution wirings 132 may be formed by forming a seed layer on an upper surface of the sealing member 100, patterning the seed layer and performing an electroplating operation.

Then, after forming a first upper insulation layer 130 on the sealing member 100, second upper redistribution wirings 172 may be formed on the first upper insulation layer 130.

For example, after the first upper insulation layer 130 is formed on/covering the first upper redistribution wirings 132, the first upper insulation layer 130 may be patterned to form openings that expose the first upper redistribution wirings 132 respectively. The second upper redistribution wiring may be formed by forming a seed layer on a portion of the first upper redistribution wiring 132 and in the opening, patterning the seed layer and performing an electro plating operation. Accordingly, at least portions of the second upper redistribution wirings 172 may directly contact the first upper redistribution wirings 132 through the openings.

Similarly, after a second upper insulation layer 170 is formed on the first upper insulation layer 130, the second upper insulation layer 170 may be patterned to form openings that expose the second upper redistribution wirings 172. The, third upper redistribution wirings 182 may be formed on the second upper insulation layer 170 to directly contact the second upper redistribution wirings 172 through the openings.

Accordingly, the second redistribution wirings may include a first upper redistribution wiring and a second upper redistribution wiring stacked in at least two levels. In this case, the second redistribution wirings may include the first to third upper redistribution wirings 132, 172 and 182, and the third upper redistribution wiring 182 may correspond to an uppermost second redistribution wiring of the second redistribution wirings.

As illustrated in FIG. 29, second bonding pads 190 may be formed on the third upper redistribution wirings 342 as the uppermost second redistribution wirings respectively.

For example, operations that are the same as or similar to the operations described with reference to FIGS. 10 to 15 may be performed to form the second bonding pad 190 on a redistribution pad of the third upper redistribution wiring 182. In this case, the second bonding pad 190 may include first, second and third plating patterns sequentially stacked on the redistribution pad of the third upper redistribution wirings 182. A diameter of the first plating pattern may gradually decrease toward the top. A diameter of a lower portion of the first plating pattern may be greater than a diameter of an upper portion of the first plating pattern. The diameter of the lower portion of the first plating pattern may be equal to or smaller than a diameter of the redistribution pad. The lower portion of the first plating pattern may be formed on/covering the entire upper surface of the redistribution pad.

Then, a solder resist layer 180 as a fourth upper insulation layer may be formed on the second upper insulation layer 172 to cover the third upper redistribution wirings 182 and expose at least a portion of the second bonding pad 190. Accordingly, the upper redistribution wiring layer 198 having the second redistribution wirings 132, 172 and 182 and second bonding pads 190 may be formed.

Then, outer connection members 400 (see FIG. 22) may be formed on an outer surface of the lower redistribution wiring layer 300 to be electrically connected to the first redistribution wirings 302 respectively.

Then, a sawing operation may be performed on the lower redistribution wiring layer 300 to form an individual fan-out panel level package including the sealing member 100 as a base substrate, the lower redistribution wiring layer 300 formed on the lower surface of the sealing member 100 and the upper redistribution wiring layer 198 formed on the upper surface of the sealing member 100.

Then, as illustrated in FIG. 22, a second package 600 may be stacked on a first package as the fan-out wafer level package via conductive connection members 650. The conductive connection member 650 may be disposed between the second bonding pad 190 of the upper redistribution wiring layer 198 and a second bonding pad 614 of a second package substrate 610. Accordingly, the first package and the second package 600 may be electrically connected to each other using the conductive connection members 650.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM (Dynamic Random Access Memory) devices, HBM (High Bandwidth Memory) devices, or non-volatile memory devices such as flash memory devices, PRAM (Phase-change Random Access Memory) devices, MRAM (Magnetic Random Access Memory) devices, ReRAM (Resistive Random Access Memory) devices, or the like.

The foregoing is illustrative of some example embodiments of inventive concepts and is not to be construed as limiting thereof. Although a few example embodiments have been described, those skilled in the art will readily appreciate that many modifications are possible in these example embodiments without materially departing from the novel teachings and advantages of present inventive concepts. Accordingly, all such modifications are intended to be included within the scope of inventive concepts as defined in the following claims.

What is claimed is:

1. A semiconductor package, comprising:
a core substrate having a cavity;
a semiconductor chip in the cavity of the core substrate, wherein the semiconductor chip has chip pads;
a lower redistribution wiring layer on a first surface of the core substrate, the lower redistribution wiring layer including first redistribution wirings electrically connected to the chip pads of the semiconductor chip;
a sealing layer on a second surface of the core substrate opposite to the first surface of the core substrate, wherein the sealing layer fills portions of the cavity adjacent the semiconductor chip;
second redistribution wirings on the sealing layer, wherein the second redistribution wirings are electrically connected to conductive structures that extend through the core substrate, and wherein the second redistribution wiring includes a redistribution pad; and
a bonding pad on the redistribution pad of the second redistribution wiring, wherein the bonding pad includes
a first plating pattern on the redistribution pad, the first plating pattern having an inclined sidewall with a diameter that decreases with increasing distance from the core substrate,
a second plating pattern on the first plating pattern, and a third plating pattern on the second plating pattern, wherein the third plating pattern has a diameter that is the same as a diameter of the second plating pattern.

2. The semiconductor package of claim 1, wherein the first plating pattern includes a material that is the same as a material of the redistribution pad.

3. The semiconductor package of claim 2, wherein the first plating pattern and the redistribution pad both include copper.

4. The semiconductor package of claim 1, wherein the second plating pattern includes nickel (Ni), and the third plating pattern includes gold (Au).

5. The semiconductor package of claim 1, wherein the first plating pattern includes
a base portion having a diameter that is less than a diameter of the redistribution pad, and
an edge portion protruding from the base portion to at least partially surround an outer surface of the base portion, wherein the edge portion has the inclined sidewall.

6. The semiconductor package of claim 5, wherein the first plating pattern further includes a head portion on the base portion, wherein the head portion has a diameter that is the same as the diameter of the base portion.

7. The semiconductor package of claim 5, wherein a width of the edge portion is within a range of about 10 μm to 20 μm.

8. The semiconductor package of claim 5, wherein a height of the edge portion is within a range of about 0.5 μm to 2 μm.

9. The semiconductor package of claim 1, wherein the first plating pattern has a first thickness, the second plating pattern has a second thickness greater than the first thickness, and the third plating pattern has a third thickness less than the second thickness.

10. The semiconductor package of claim 1, further comprising:
a solder resist layer on the second redistribution wirings and exposing at least a portion of the bonding pad.

11. A semiconductor package, comprising:
a first redistribution wiring layer including first redistribution wirings;
a semiconductor chip on the first redistribution wiring layer and electrically connected to the first redistribution wirings;
a base substrate on the first redistribution wiring layer, wherein the base substrate at least partially surrounds the semiconductor chip; and
a second redistribution wiring layer on the base substrate so that the base substrate and the semiconductor chip are between the first redistribution wiring layer and the second redistribution wiring layer, the second redistribution wiring layer including a sealing layer on the semiconductor chip, second redistribution wirings electrically connected to a conductive structure of the base substrate, and a bonding pad on a redistribution pad of the second redistribution wiring, wherein the bonding pad includes
a first plating pattern on the redistribution pad, the first plating pattern including a base portion having a diameter that is less than a diameter of the redistribution pad and an edge portion protruding from the base portion to at least partially surround an outer surface of the base portion, wherein the edge portion has an inclined sidewall such that a diameter of the edge portion decreases with increasing distance from the base substrate, a second plating pattern on the first plating pattern, and a third plating pattern on the second plating pattern.

12. An electronic package, comprising:

a redistribution wiring layer including redistribution wiring with a redistribution pad; and a bonding pad on the redistribution pad of the redistribution wiring, wherein the bonding pad includes a first plating pattern on the redistribution pad, wherein the first plating pattern comprises a first material, wherein the first plating pattern has an inclined sidewall so that a diameter of the first plating pattern decreases with increasing distance from the redistribution pad, and so that a first diameter of the first plating pattern adjacent the redistribution pad is greater than a second diameter of the first plating pattern spaced apart from the redistribution pad, a second plating pattern on the first plating pattern, wherein the second plating pattern comprises a second material different than the first material, and a third plating pattern on the second plating pattern, wherein the third plating pattern comprises a third material different than the second material, wherein the second and third plating patterns have a same diameter that is no greater than the second diameter of the first plating pattern.

13. The electronic package of claim 12, wherein the redistribution pad comprises the first material.

14. The electronic package of claim 13, wherein the first material comprises copper (Cu).

15. The electronic package of claim 12, wherein the second material comprises nickel (Ni) and the third material comprises gold (Au).

16. The electronic package of claim 12, wherein the first plating pattern includes a head portion, wherein the head portion has the same diameter as the second and third plating patterns.

17. The electronic package of claim 12, wherein the first plating pattern has a first thickness, wherein the second plating pattern has a second thickness greater than the first thickness, and the third plating pattern has a third thickness less than the second thickness.

18. The electronic package of claim 12 further comprising:

a solder resist layer on the redistribution wiring layer, wherein the solder resist layer has an opening exposing a portion of the bonding pad; and an interconnection solder structure on the exposed portion of the bonding pad.

19. The electronic package of claim 18, wherein the redistribution wiring layer is a first redistribution wiring layer, wherein the redistribution wiring is first redistribution wiring, and wherein the solder resist layer is on a first surface of the first redistribution wiring layer, the electronic device package further comprising:

a packaging substrate on a second surface of the redistribution wiring layer, wherein the first redistribution wiring layer is between the packaging substrate and the solder resist layer, and wherein the packaging substrate defines a chip cavity;

a semiconductor chip in the chip cavity of the packaging substrate;

a second redistribution wiring layer on the packaging substrate, wherein the packaging substrate and the semiconductor chip are between the first and second redistribution wiring layers, wherein the second redistribution wiring layer includes second redistribution wiring, wherein the first and second redistribution wirings are electrically coupled through the packaging substrate, and wherein the semiconductor chip and the second redistribution wiring are electrically coupled.

* * * * *